United States Patent
Kim et al.

(10) Patent No.: US 11,877,500 B2
(45) Date of Patent: Jan. 16, 2024

(54) MASK ASSEMBLY

(71) Applicant: Samsung Display Co., Ltd., Yongin-Si (KR)

(72) Inventors: Sanghoon Kim, Hwaseong-si (KR); Jongbum Kim, Yongin-si (KR); Yeonju Kang, Hwaseong-si (KR); Jongsung Park, Hwaseong-si (KR); Sangshin Lee, Yongin-si (KR); Seungjin Lee, Suwon-si (KR); Eunjoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 293 days.

(21) Appl. No.: 17/206,757

(22) Filed: Mar. 19, 2021

(65) Prior Publication Data

US 2021/0391541 A1 Dec. 16, 2021

(30) Foreign Application Priority Data

Jun. 15, 2020 (KR) .................. 10-2020-0072462

(51) Int. Cl.
*H01L 51/56* (2006.01)
*H10K 71/16* (2023.01)
(Continued)

(52) U.S. Cl.
CPC ......... *H10K 71/166* (2023.02); *C23C 14/042* (2013.01); *H10K 71/00* (2023.02); *H10K 71/164* (2023.02)

(58) Field of Classification Search
CPC .......................... H10K 71/166; H10K 59/88
See application file for complete search history.

(56) References Cited

U.S. PATENT DOCUMENTS

2008/0018236 A1   1/2008  Arai et al.
2014/0150721 A1*  6/2014  Oh .................. C23C 14/042
                                              118/504
(Continued)

FOREIGN PATENT DOCUMENTS

CN   110993662 A    4/2020
EP     2802177 A1  11/2014
(Continued)

OTHER PUBLICATIONS

Extended European Search Report, Application No. 21178116.6, dated Nov. 22, 2021, 20 pages.

*Primary Examiner* — Benjamin P Sandvik
(74) *Attorney, Agent, or Firm* — Innovation Counsel LLP

(57) ABSTRACT

A mask assembly includes a mask and a blocking stick. The mask includes a pattern region formed therein with openings and extends in a first direction. The blocking stick is disposed under the mask and overlaps a first side portion of the mask. The mask further includes dummy opening regions and opening regions. The dummy opening regions are arranged in the first direction in the first side portion of the mask, and are formed therein with openings. The opening regions are arranged in the first direction in a second side portion which is opposite to the first side portion of the mask and correspond to the dummy opening regions, respectively. The number of the openings per a unit area in each of the dummy opening region and the opening region is smaller than the number of the openings per a unit area in the pattern region.

20 Claims, 16 Drawing Sheets

(51) Int. Cl.
*C23C 14/04* (2006.01)
*H10K 71/00* (2023.01)

(56) References Cited

U.S. PATENT DOCUMENTS

| | | | |
|---|---|---|---|
| 2015/0007768 A1* | 1/2015 | Lee | B05C 21/005 |
| | | | 118/504 |
| 2015/0047560 A1* | 2/2015 | Kang | H10K 71/166 |
| | | | 118/504 |
| 2015/0101536 A1* | 4/2015 | Han | C23C 14/042 |
| | | | 118/721 |
| 2015/0147838 A1* | 5/2015 | Ookawara | H10K 71/00 |
| | | | 438/34 |
| 2016/0079568 A1 | 3/2016 | Han | |
| 2016/0312354 A1* | 10/2016 | Ko | H10K 71/60 |
| 2017/0179390 A1* | 6/2017 | Baek | H10K 71/00 |
| 2017/0250208 A1* | 8/2017 | Kim | B05C 21/005 |
| 2018/0202034 A1 | 7/2018 | Lin et al. | |
| 2019/0276927 A1 | 9/2019 | Wang et al. | |
| 2019/0393444 A1 | 12/2019 | Nam et al. | |
| 2020/0385856 A1 | 12/2020 | Yamabuchi et al. | |
| 2021/0159281 A1* | 5/2021 | Kim | H10K 50/11 |
| 2021/0265396 A1 | 8/2021 | Kim et al. | |

FOREIGN PATENT DOCUMENTS

| | | |
|---|---|---|
| EP | 3473744 A1 | 4/2019 |
| EP | 3588240 A2 | 1/2020 |
| EP | 3813121 A1 | 4/2021 |
| EP | 3826070 A2 | 5/2021 |
| KR | 10-2017-0105684 A | 9/2017 |
| KR | 10-2018-0085114 A | 7/2018 |
| KR | 10-2018-0089925 A | 8/2018 |
| WO | 2019064420 A1 | 4/2019 |

* cited by examiner

FIG. 11
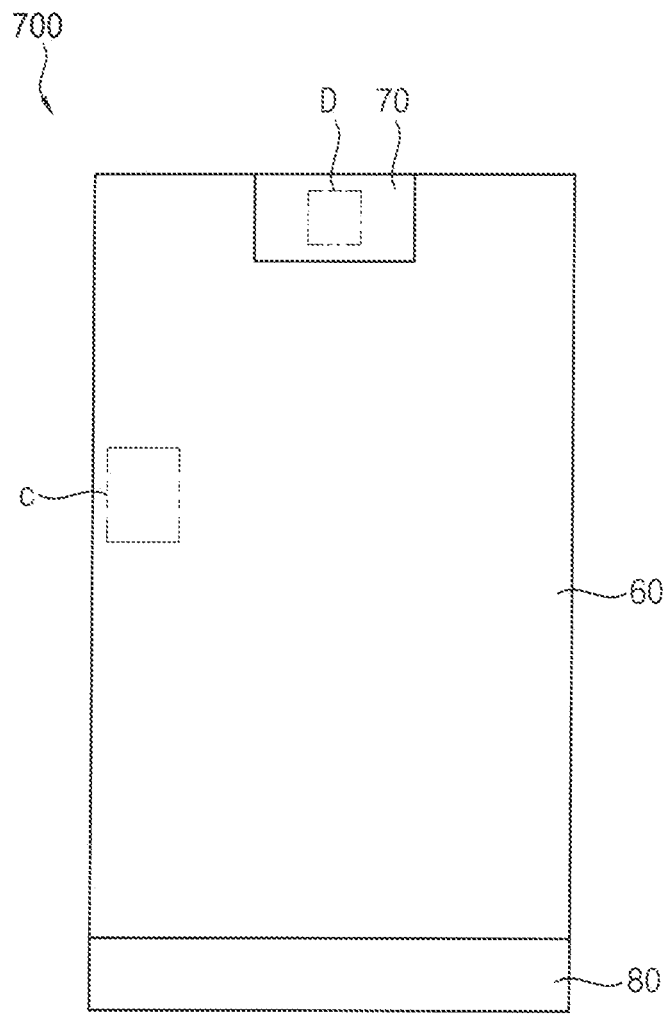
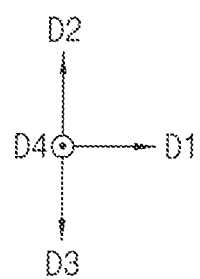

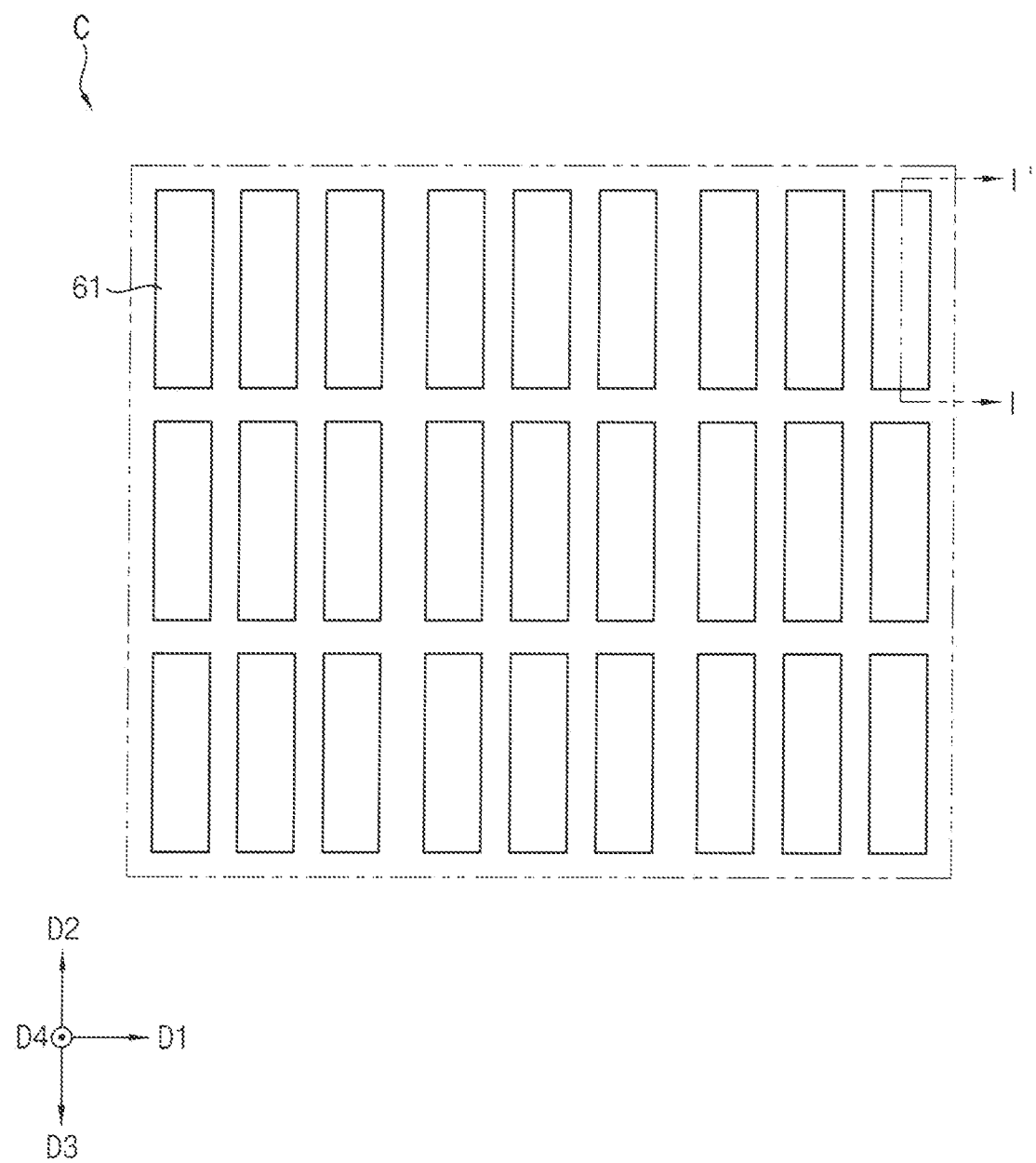

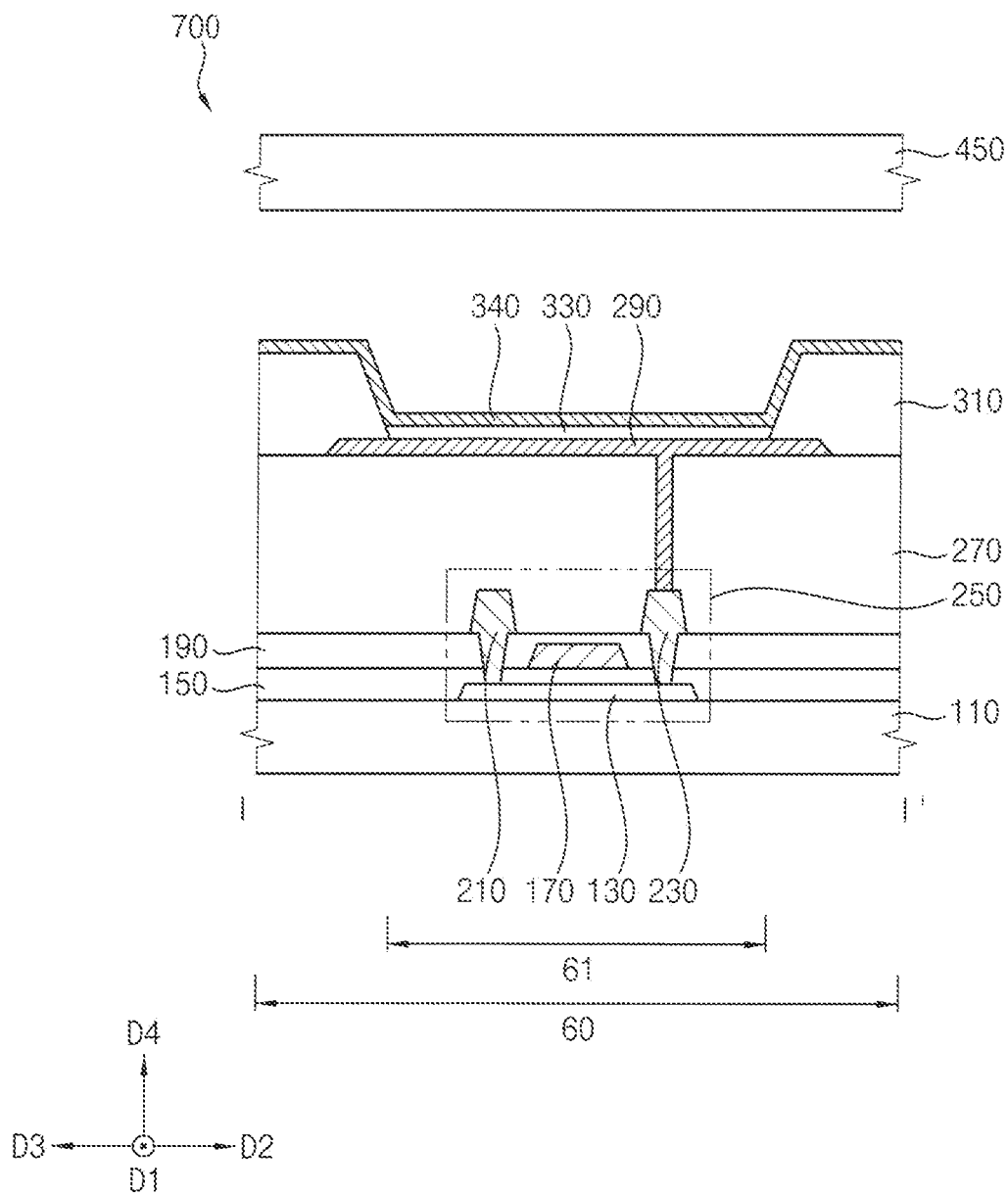

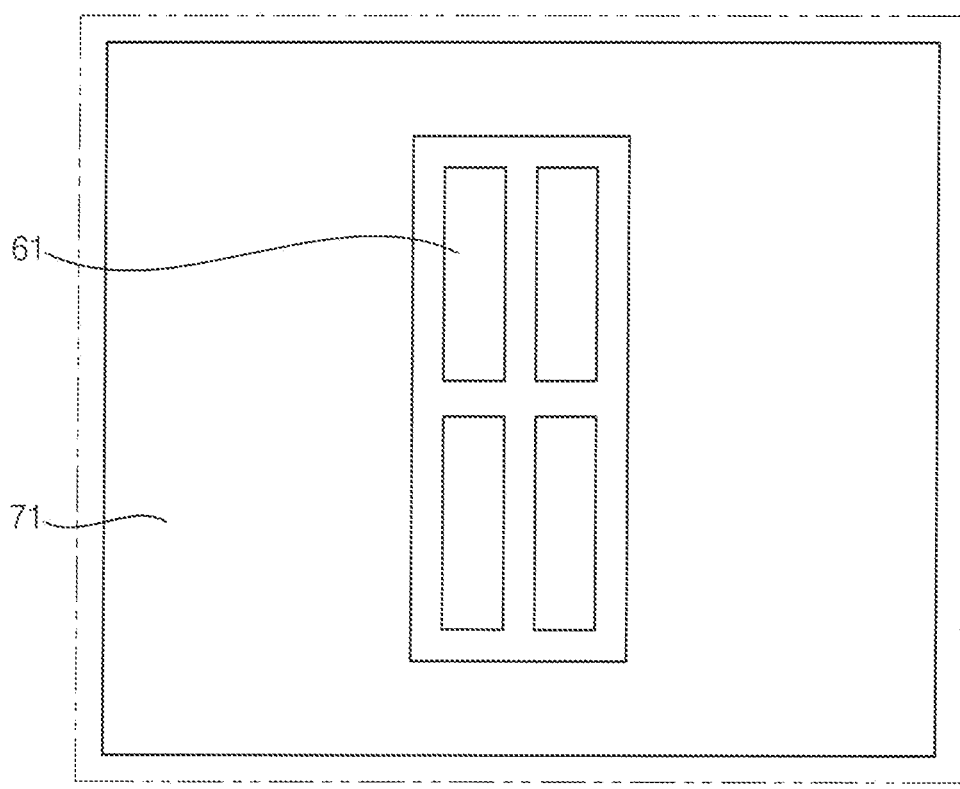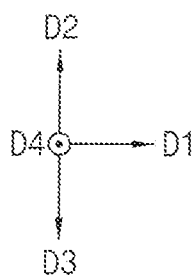

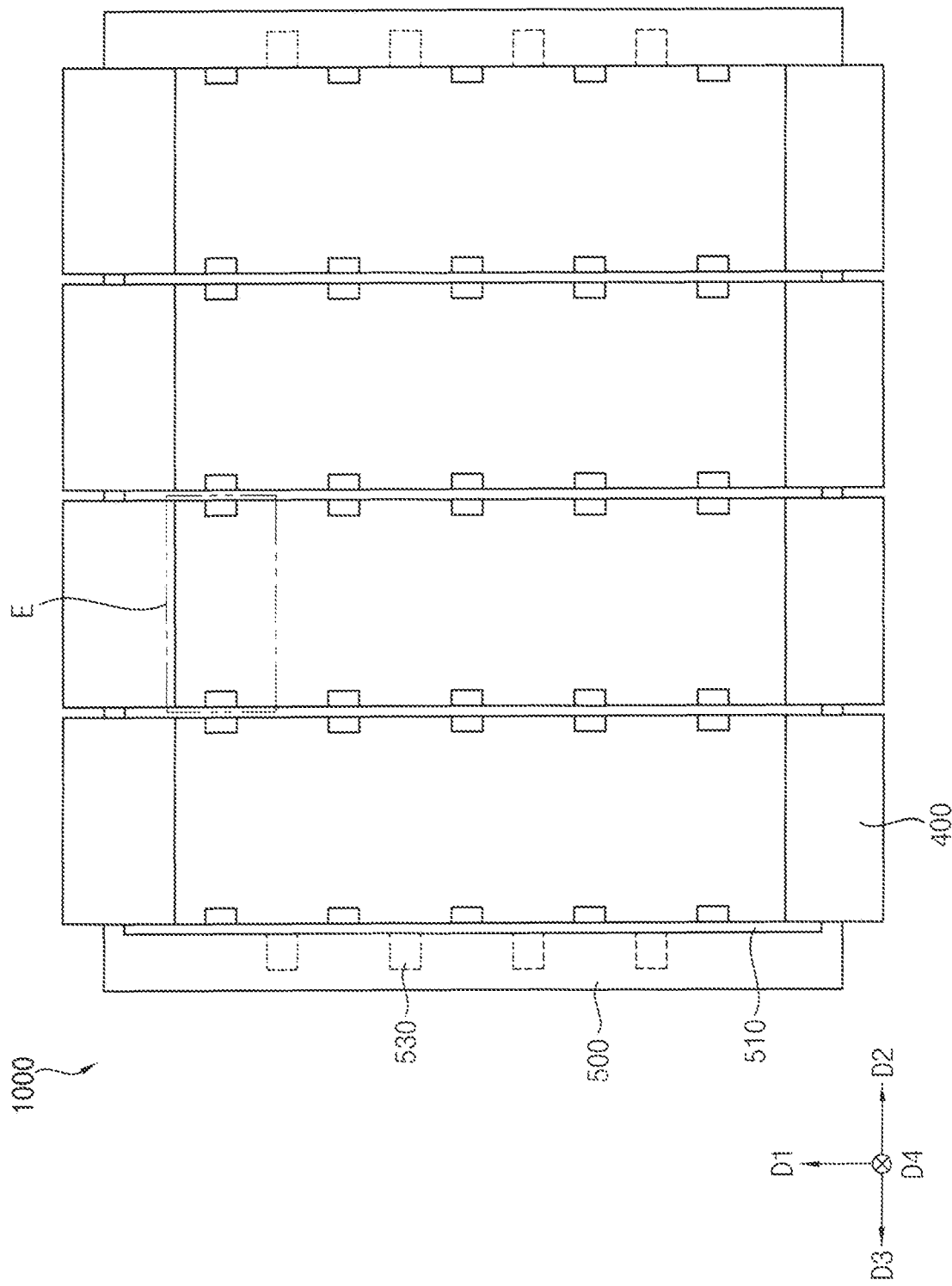

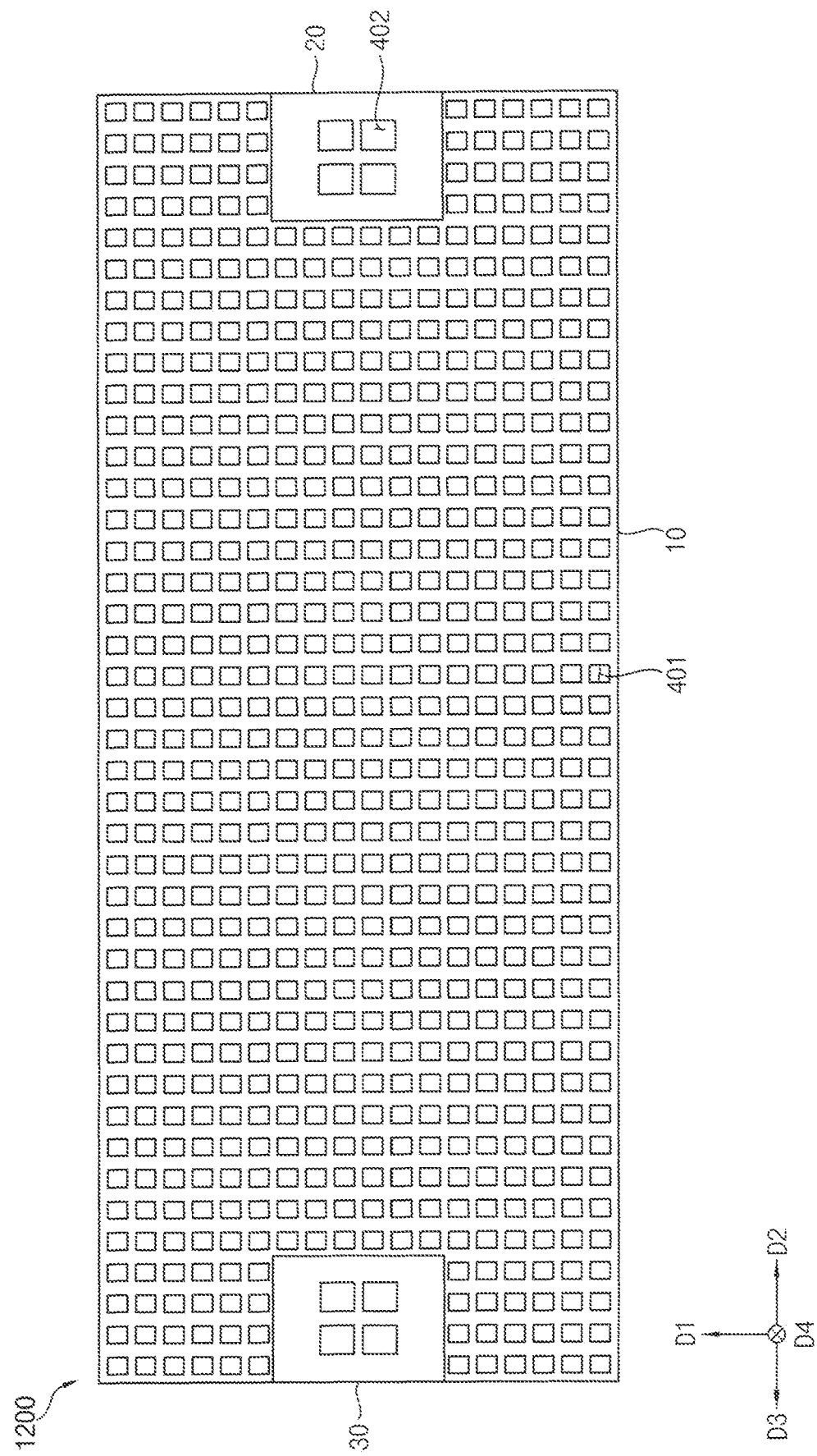

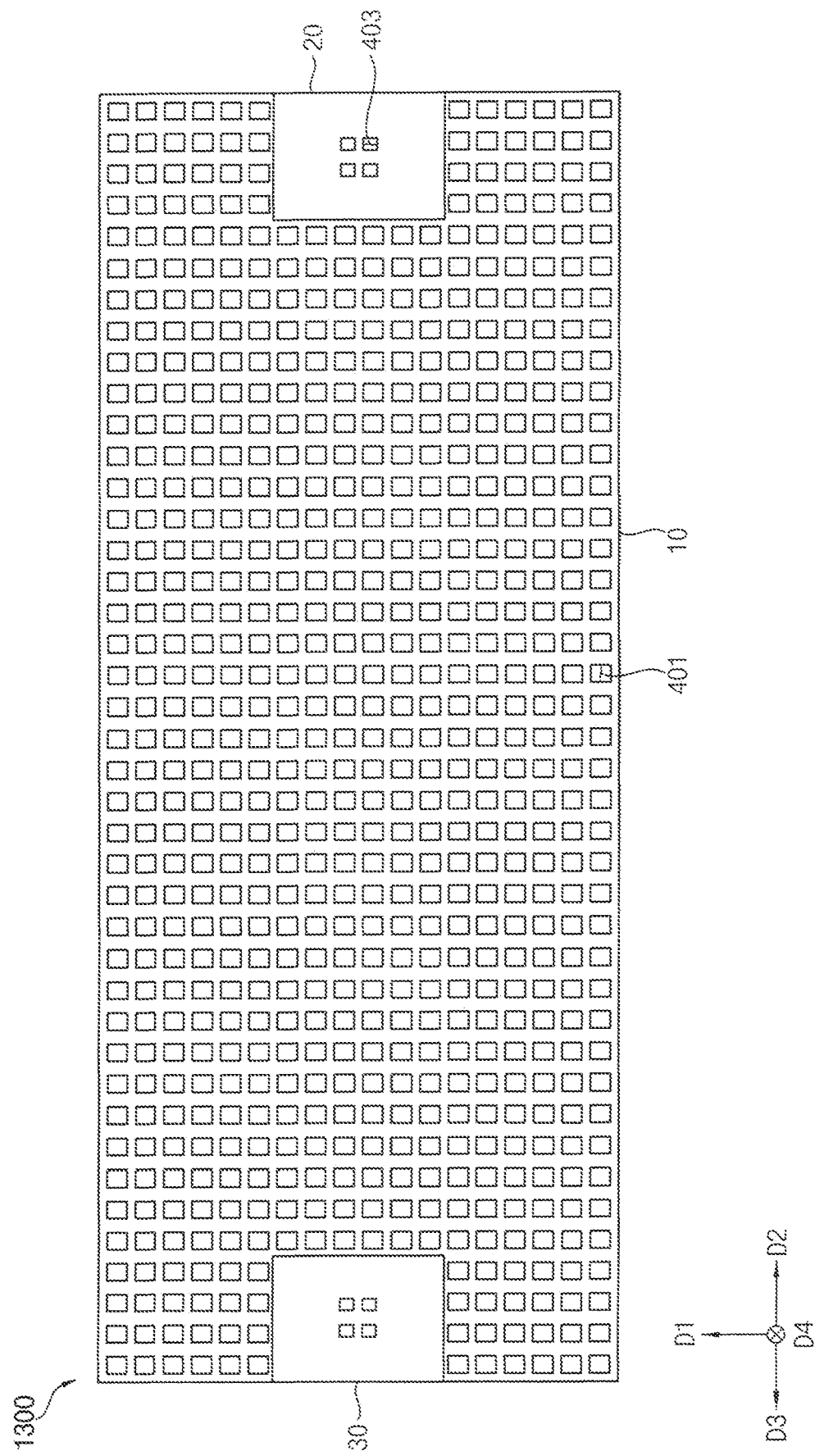

MASK ASSEMBLY

CROSS-REFERENCE TO RELATED APPLICATION

This application claims priority under 35 USC § 119 to Korean Patent Application No. 10-2020-0072462 filed on Jun. 15, 2020 in the Korean Intellectual Property Office (KIPO), the entire disclosure of which is incorporated herein by reference.

BACKGROUND

1. Field

Embodiments of the present disclosure generally relate to a mask assembly. More particularly, embodiments of the present disclosure relate to a mask assembly for depositing an organic light emitting layer.

2. Description of the Related Art

Flat panel display devices are used as display devices for replacing a cathode ray tube display device due to light-weight and thin characteristics thereof. As representative examples of such flat panel display devices, there are a liquid crystal display device and an organic light emitting diode display device.

The organic light emitting diode display device may include a display region for displaying an image through a first surface of the display device and a module region in which an optical module is disposed on a second surface of the display device. Recently, an organic light emitting layer may be disposed in the module region so that the image may be displayed even in the module region. In this case, since the optical module is required to operate by using external light incident from the first surface, a transmission window may be formed in the module region so that the external light may pass through the organic light emitting diode display device. The external light may pass through the organic light emitting diode display device through the transmission window. For example, the display region may include pixel regions arranged at equidistant intervals and formed therein with organic light emitting layers, respectively, and the module region may include pixel regions formed therein with organic light emitting layers, respectively, and transmissive regions formed therein with transmission windows, respectively. In other words, numbers of pixel regions per a unit area in the display region and the module region may be different from each other.

A fine metal mask may be used to deposit the organic light emitting layers, and a plurality of openings may be formed in the mask. The openings may correspond to the pixel regions. In this case, a portion corresponding to the display region of the organic light emitting diode display device is defined as a first portion of the mask, and a portion corresponding to the module region of the organic light emitting diode display device is defined as a second portion of the mask. Since the numbers of pixel regions per a unit area in the display region and the module region are different from each other, numbers of openings per a unit area in the first portion and the second portion of the mask may be different from each other. When the mask is stretched and fixed to a frame, since the numbers of openings per a unit area in the first and second portions are different from each other, deformation (e.g., a bending phenomenon) of the mask may occur, and the organic light emitting layers may not be accurately formed in each of the pixel regions. Thus, there is need to develop a novel mask assembly to deposit an organic emitting layer without substantial deformation.

SUMMARY

Some embodiments provide a mask assembly for depositing an organic light emitting layer.

According to some embodiments, a mask assembly includes a mask and a blocking stick. The mask includes a pattern region formed therein with openings, and extends in a first direction. The blocking stick is disposed under the mask, and overlaps a first side portion of the mask. The blocking stick extends in the first direction. The mask further includes dummy opening regions and opening regions. The dummy opening regions are arranged in the first direction in the first side portion of the mask, and are formed therein with openings. The opening regions are arranged in the first direction in a second side portion that is opposite to the first side portion of the mask, and correspond to the dummy opening regions, respectively. The opening regions are formed therein with openings. The number of the openings per a unit area in each of the dummy opening region and the opening region is smaller than the number of the openings per a unit area in the pattern region.

In embodiments, the number of the openings formed in each of the dummy opening regions may be equal to the number of the openings formed in each of the opening regions.

In embodiments, a shape in which the openings formed in each of the dummy opening regions may be arranged, and a shape in which the openings formed in each of the opening regions are arranged may be identical and symmetrical to each other.

In embodiments, the pattern region may be located between two dummy opening regions adjacent to each other in the first direction among the dummy opening regions in the first side portion.

In embodiments, a deposition material may not pass through the openings formed in the pattern region overlapping the first side portion and the openings formed in the dummy opening region.

In embodiments, n the blocking stick may overlap the openings formed in the pattern region overlapping the first side portion and the openings formed in the dummy opening region.

In embodiments, the pattern region may be located between two opening regions adjacent to each other in the first direction among the opening regions in the second side portion.

In embodiments, a deposition material may pass through the openings formed in the pattern region overlapping the second side portion, the openings formed in the opening region, and the openings formed in the pattern region that does not overlap the first and second side portions.

In embodiments, the pattern region may surround at least a part of each of the dummy opening regions and the opening regions.

In embodiments, the mask assembly may further include support sticks disposed under the mask. The support sticks each may extend in a second direction orthogonal to the first direction, and may be spaced apart from each other in the first direction.

In embodiments, the support sticks may be spaced apart from each other at a first interval, and the support sticks may be disposed under the blocking stick.

In embodiments, a deposition material may not pass through the openings formed in the pattern region overlapping the support sticks and the blocking stick.

In embodiments, one of the support sticks may extend to overlap a portion between two dummy opening regions adjacent to each other in the first direction among the dummy opening regions in the first side portion and a portion between two opening regions facing the two dummy opening regions.

In embodiments, the mask assembly may further include a mask frame disposed under the mask, and may be fastened to both side portions of each of the blocking stick and both side portions of each of the support sticks. The mask frame may have an opening that exposes the pattern region of the mask.

In embodiments, the mask may further include fixing regions located in upper and lower portions of the pattern region, the fixing regions face each other in the first direction, and a part of each of the fixing regions overlaps the mask frame.

In embodiments, the mask may include first to $n^{th}$ masks (where n is an integer greater than or equal to 1), and $k^{th}$ and $(k+1)^{th}$ masks (where k is an integer between 1 and n) among the first to $n^{th}$ masks may be spaced apart from each other in a second direction orthogonal to the first direction.

In embodiments, the blocking stick may include first to $m^{th}$ blocking sticks (where m is an integer greater than or equal to 1), and a $j^{th}$ blocking stick (where j is an integer between 1 and m) among the first to $m^{th}$ blocking sticks may overlap a first side portion of the $(k+1)^{th}$ mask without overlapping a second side portion of the $k^{th}$ mask.

In embodiments, the openings of the pattern region adjacent to the dummy opening region in a second direction may overlap the blocking stick.

In embodiments, no openings may be formed in the pattern region adjacent to the dummy opening region in a second direction.

According to some embodiments, a mask assembly includes a mask and a blocking stick. The mask includes a pattern region formed therein with openings, and extends in a first direction. The blocking stick is disposed under the mask, and overlaps a first side portion of the mask. The blocking stick extends in the first direction. The mask further includes: dummy opening regions and opening regions. The dummy opening regions are arranged in the first direction in the first side portion of the mask, and are formed therein with openings. The opening regions are arranged in the first direction on a second side portion that is opposite to the first side portion of the mask, and correspond to the dummy opening regions, respectively. The opening regions are formed therein with openings. The number of the openings per a unit area in each of the dummy opening region and the opening region is smaller than the number of the openings per a unit area in the pattern region. A size of each of the openings formed in the opening region is different from a size of each of the openings formed in the pattern region.

According to the embodiments of the present disclosure, the mask assembly may include dummy opening regions and a pattern region surrounding at least a part of each of the dummy opening regions. In this case, the first side portion and the second side portion of the mask may be symmetrical to each other, and the bending phenomenon may not occur even when the fixing regions are clamped and stretched. Accordingly, when the organic light emitting layer is deposited by using the mask assembly, the openings may accurately correspond to the sub-pixel regions, and the deposition failure of the organic light emitting layer may not occur.

According to the embodiments of the present disclosure, the mask assembly may include a mask having a blocking region. In this case, since the openings are not formed in the blocking region, the blocking stick may ensure a manufacturing tolerance as much as the blocking region. Accordingly, the blocking stick may easily cover the non-display region, and the organic light emitting layer may not be deposited onto the non-display region.

BRIEF DESCRIPTION OF THE DRAWINGS

Embodiments can be understood in more detail from the following description taken in conjunction with the accompanying drawings, in which:

FIG. 11 is a plan view showing a display region and a module region included in the organic light emitting diode display device of FIG. 9;

FIG. 12 is a partially enlarged plan view showing an area 'C' of FIG. 11;

FIG. 13 is a sectional view taken along line I-I' of FIG. 12;

FIG. 14 is a partially enlarged plan view showing an area 'D' of FIG. 11;

FIG. 15 is a plan view showing a mask assembly according to embodiments of the present disclosure;

FIG. 17 is a plan view showing a mask assembly according to embodiments of the present disclosure; and FIG. 18 is a plan view showing a mask assembly according to embodiments of the present disclosure.

DETAILED DESCRIPTION OF THE EMBODIMENTS

Figure 1:
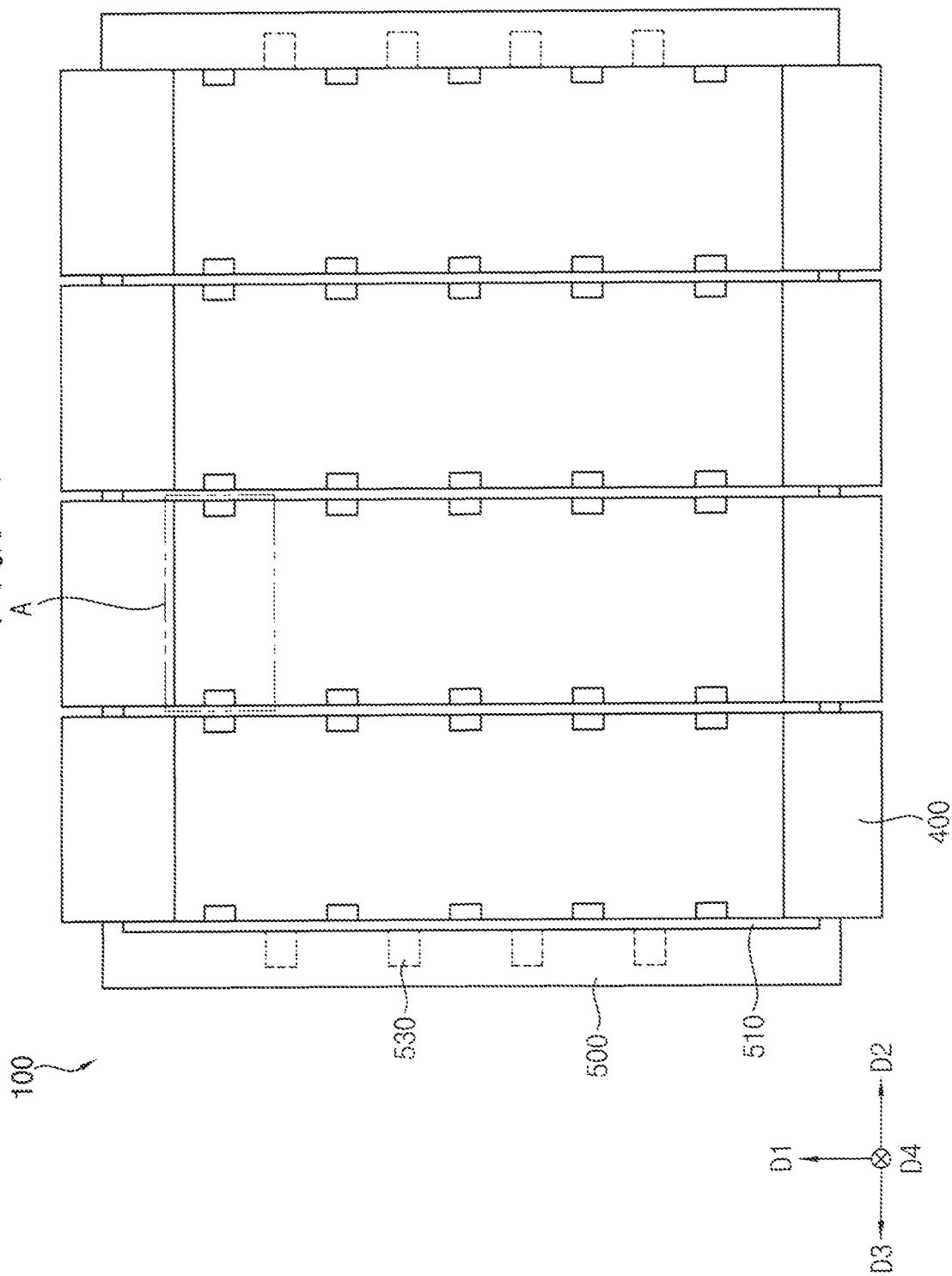
FIG. 1 is a plan view showing a mask assembly according to embodiments of the present disclosure.

Hereinafter, mask assembly according to embodiments of the present disclosure will be described in detail with reference to the accompanying drawings. In the accompanying drawings, same or similar reference numerals refer to the same or similar elements.

Figure 2:
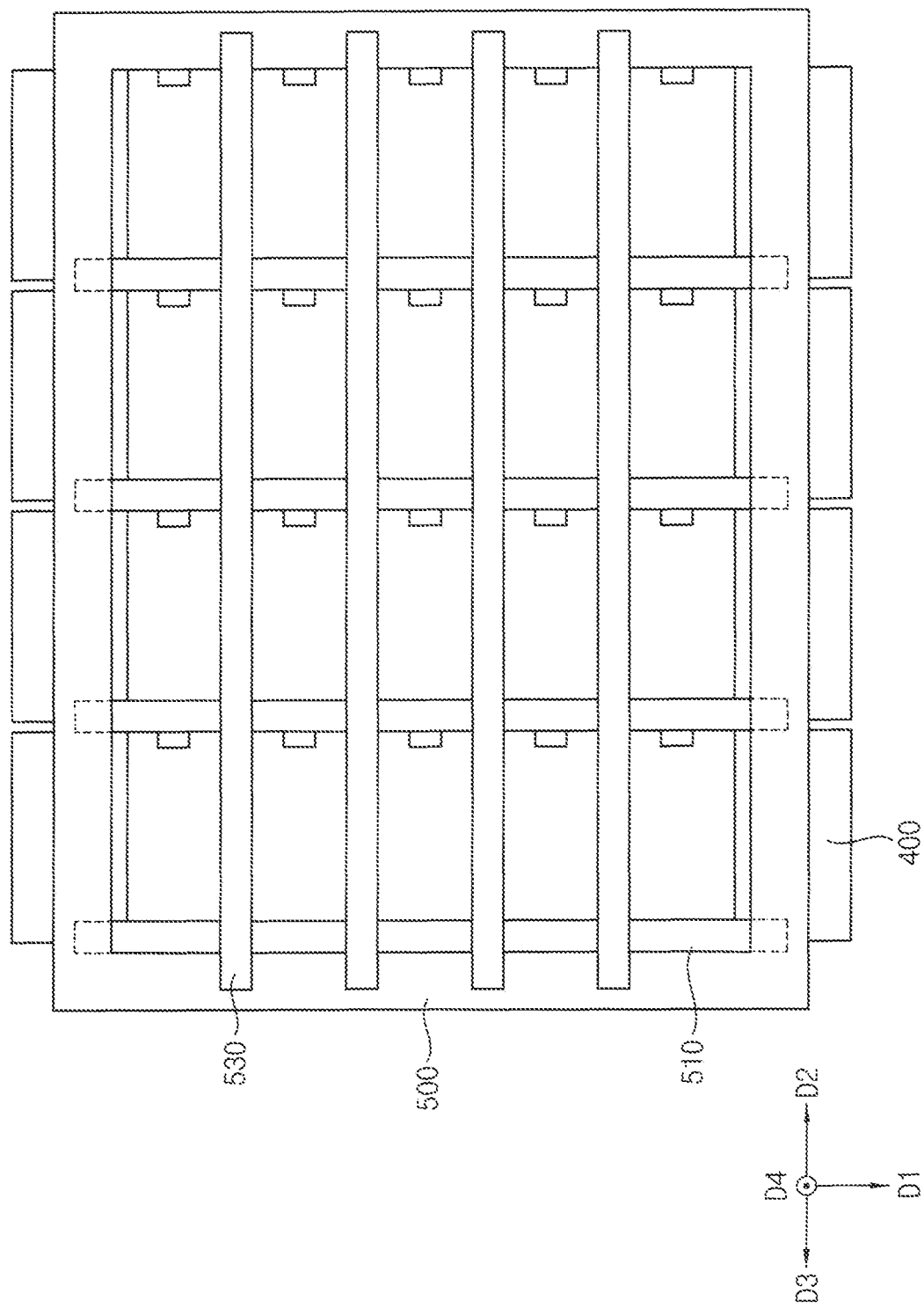
FIG. 2 is a plan view showing a rear surface of the mask assembly of FIG. 1.
Figure 3:
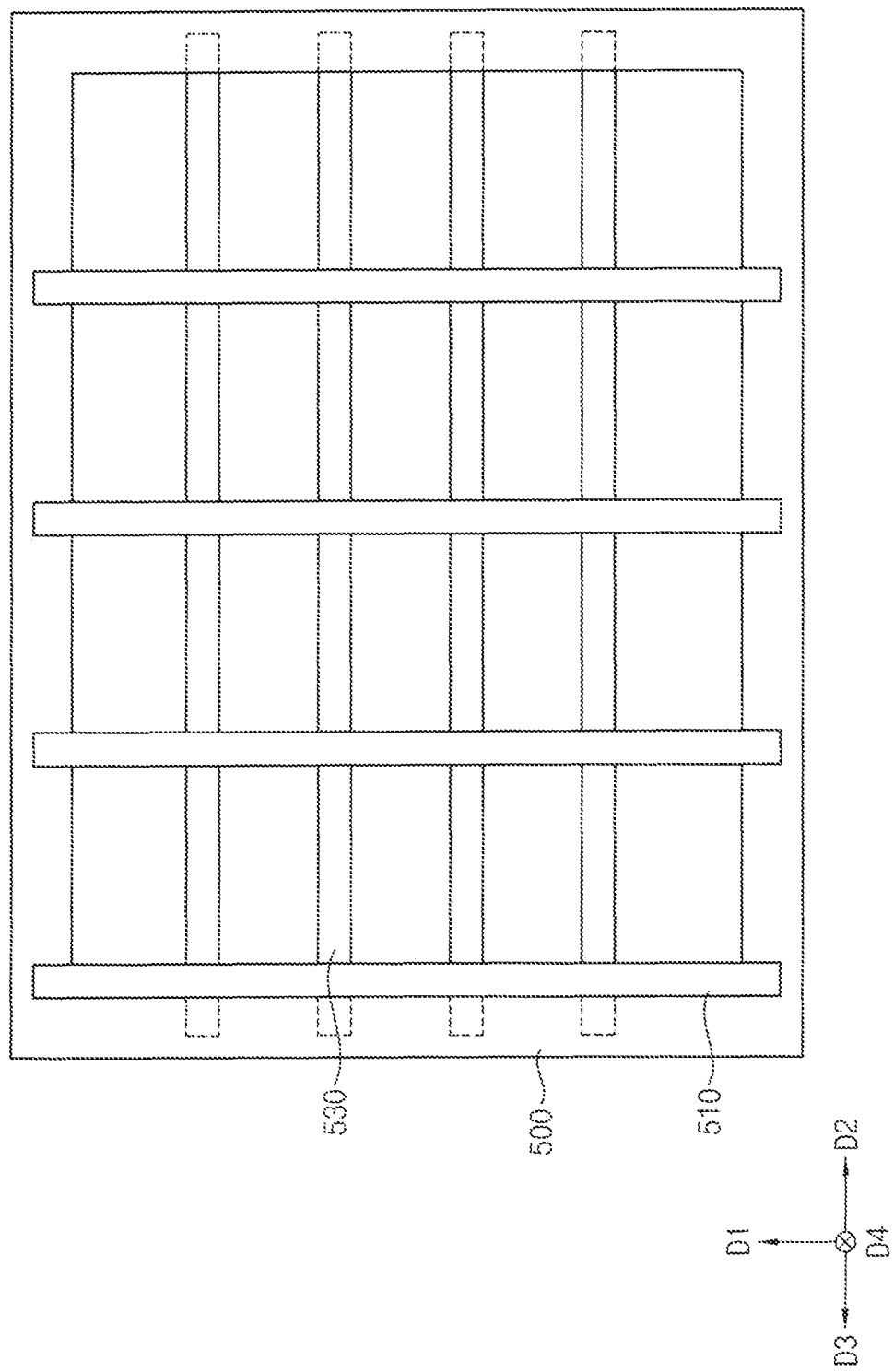
FIG. 3 is a plan view for describing a mask frame, a support stick, and a blocking stick included in the mask assembly of FIG. 1.
Figure 4:
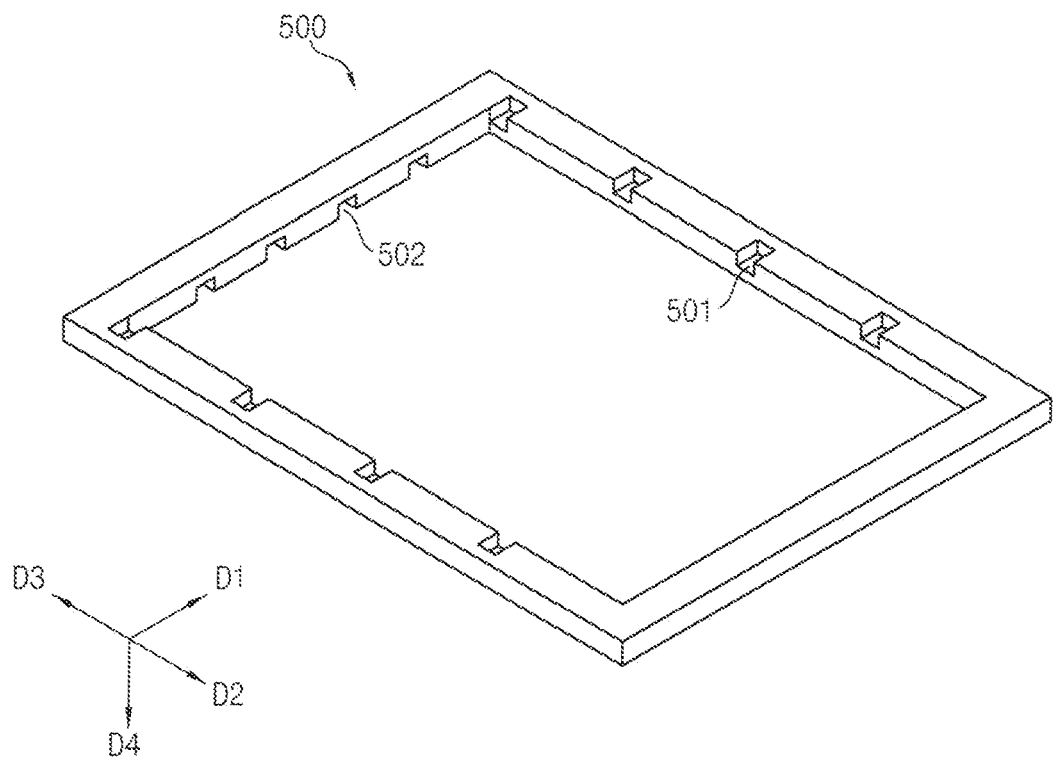
FIG. 4 is a perspective view showing the mask frame included in the mask assembly of FIG. 1.
Figure 5:
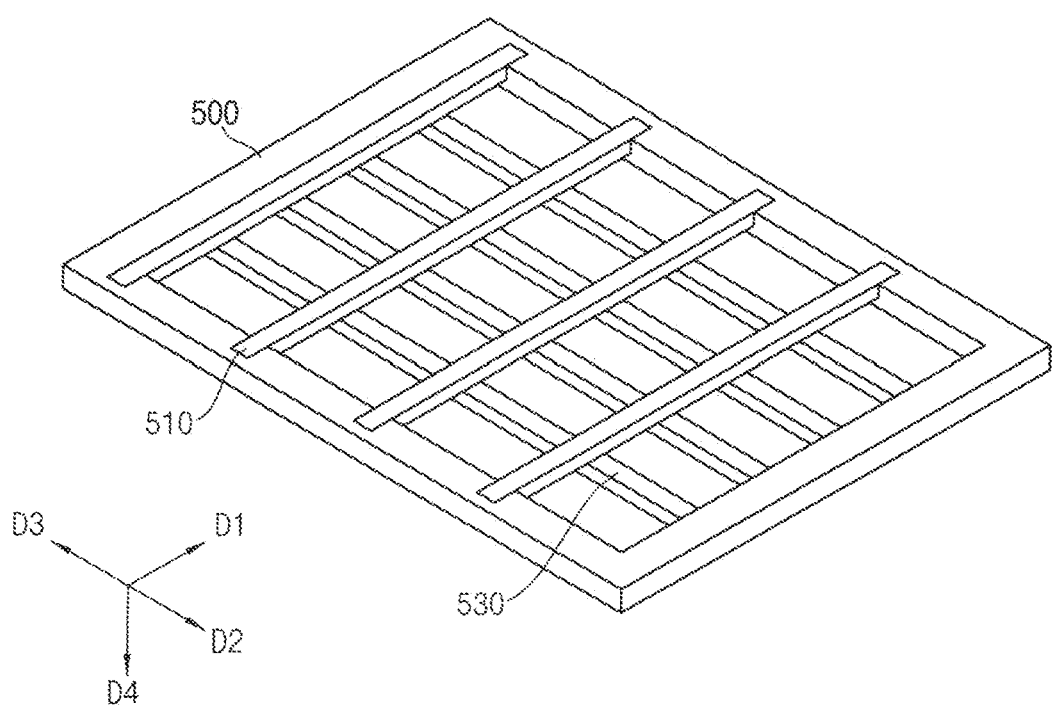
FIG. 5 is a perspective view showing the mask frame, the support stick, and the blocking stick included in the mask assembly of FIG. 1.

FIG. 1 is a plan view showing a mask assembly according to embodiments of the present disclosure, FIG. 2 is a plan view showing a rear surface of the mask assembly of FIG. 1, FIG. 3 is a plan view for describing a mask frame, a support stick, and a blocking stick included in the mask assembly of FIG. 1, FIG. 4 is a perspective view showing the mask frame included in the mask assembly of FIG. 1, and FIG. 5 is a perspective view showing the mask frame, the support stick, and the blocking stick included in the mask assembly of FIG. 1.

Referring to FIGS. 1, 2, 3, 4, and 5, a mask assembly 100 may include masks 400, a mask frame 500, blocking sticks 510, support sticks 530, and the like. For example, the mask assembly 100 may correspond to a device for depositing an organic light emitting material onto a plurality of cells formed in a mother substrate.

Each of the masks 400 may extend in a first direction D1, and may be spaced apart from each other in a second direction D2 orthogonal to the first direction D1. Each of the masks 400 may have a first side portion and a second side portion opposite to the first side portion. In embodiments, a plurality of openings may be formed in each of the masks 400, and the organic light emitting material may pass through the openings. The masks 400 may include a metallic material. For example, the masks 400 may be formed by using steel use stainless (SUS).

The blocking sticks 510 may be disposed under the masks 400. The blocking sticks 510 may prevent the masks 400 from sagging, and may block the organic light emitting material from passing through the masks 400. The blocking sticks 510 may be spaced apart from each other in the second direction D2, and each of the blocking sticks 510 may extend in the first direction D1. In the embodiments, each of the blocking sticks 510 may overlap the first side portion of each of the masks 400. In FIG. 1, the blocking sticks 510 may be exposed through separation spaces between the masks 400. The blocking sticks 510 may include a metallic material. For example, the blocking sticks 510 may be formed by using SUS.

The support sticks 530 may be disposed under the masks 400. The support sticks 530 may prevent the masks 400 from sagging, and may block the organic light emitting material from passing through the masks 400. The support sticks 530 may be spaced apart from each other in the first direction D1, and each of the support sticks 530 may extend in the second direction D2. In the embodiments, the support sticks 530 may be spaced apart from each other at a first interval. For example, a deposition source configured to discharge an organic light emitting material may be located in a fourth direction D4, which is perpendicular to the first direction D1 and the second direction D2, from the masks 400, and as shown in FIG. 2, the organic light emitting material may pass through the openings located in portions where the masks 400 are exposed, in which the portions are defined by the mask frame 500, the blocking sticks 510, and the support sticks 530. In other words, the organic light emitting material may not pass through portions where the mask frame 500, the blocking sticks 510, and the support sticks 530 are located. In addition, the portions where the masks 400 are exposed, which are defined by the mask frame 500, the blocking sticks 510, and the support sticks 530, may correspond to the cells, respectively. Moreover, the support sticks 530 may be disposed under the blocking sticks 510. In some embodiments, the blocking sticks 510 may be disposed under the support sticks 530. The support sticks 530 may include a metallic material. For example, the support sticks 530 may be formed by using SUS.

For example, the masks 400 may include first to $n^{th}$ masks (where n is an integer greater than or equal to 1), and $k^{th}$ and $(k+1)^{th}$ masks (where k is an integer between 1 and n) among the first to $n^{th}$ masks may be spaced apart from each other in the second direction D2. In addition, the blocking sticks 510 may include first to $m^{th}$ blocking sticks (where m is an integer greater than or equal to 1), and a $j^{th}$ blocking stick (where j is an integer between 1 and m) among the first to $m^{th}$ blocking sticks may overlap a first side portion of the $(k+1)^{th}$ mask without overlapping a second side portion of the $k^{th}$ mask. Moreover, the support sticks 530 may include first to $p^{th}$ support sticks (where p is an integer greater than or equal to 1), and $h^{th}$ and $(h+1)^{th}$ support sticks (where h is an integer that is greater than or equal to 1 and less than or equal to p) among the first to $p^{th}$ support sticks may be spaced apart from each other in the first direction D1. The $h^{th}$ support stick may intersect the first to $m^{th}$ blocking sticks.

The mask frame 500 may be disposed under the masks 400. The mask frame 500 may overlap a part of an upper portion and a part of a lower portion of each of the masks 400, and the masks 400 and the mask frame 500 may be fixed to each other at the overlapping parts. As shown in FIG. 4, the mask frame 500 may have a plurality of first grooves 501 and a plurality of second grooves 502. Both side portions of each of the blocking sticks 510 and both side portions of each of the support sticks 530 may be fastened to the first grooves 501 and the second grooves 502, respectively. For example, the both side portions of each of the blocking sticks 510 may be fastened to the first grooves 501, and the both side portions of each of the support sticks 530 may be fastened to the second grooves 502. The mask frame 500 may include a metallic material. For example, the mask frame 500 may be formed by using SUS.

Accordingly, the mask assembly 100 including the blocking sticks 510, the support sticks 530, the mask frame 500 to which the blocking sticks 510 and the support sticks 530 are fastened, and the masks 400 disposed on the mask frame 500 may be provided.

Figure 6:
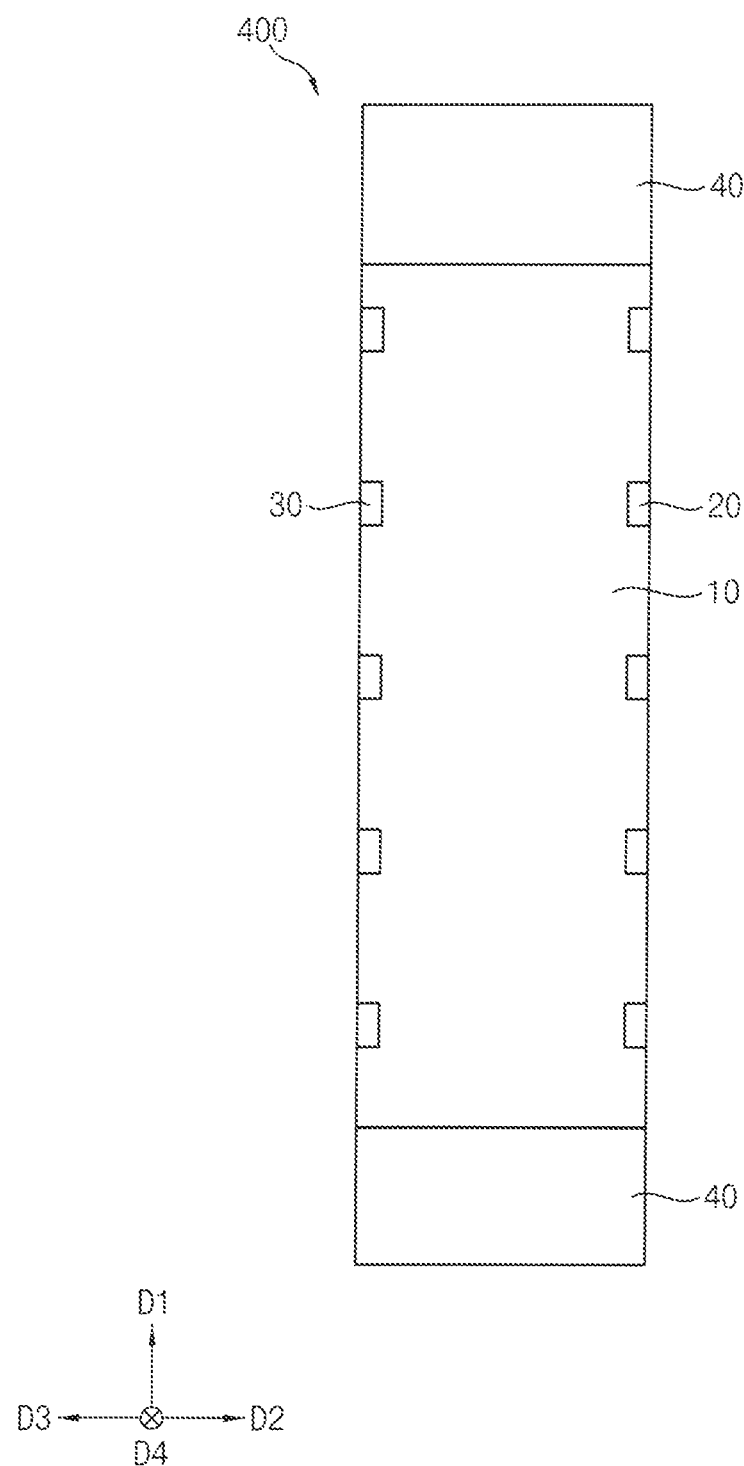
FIG. 6 is a plan view showing a mask included in the mask assembly of FIG. 1.
Figure 7:
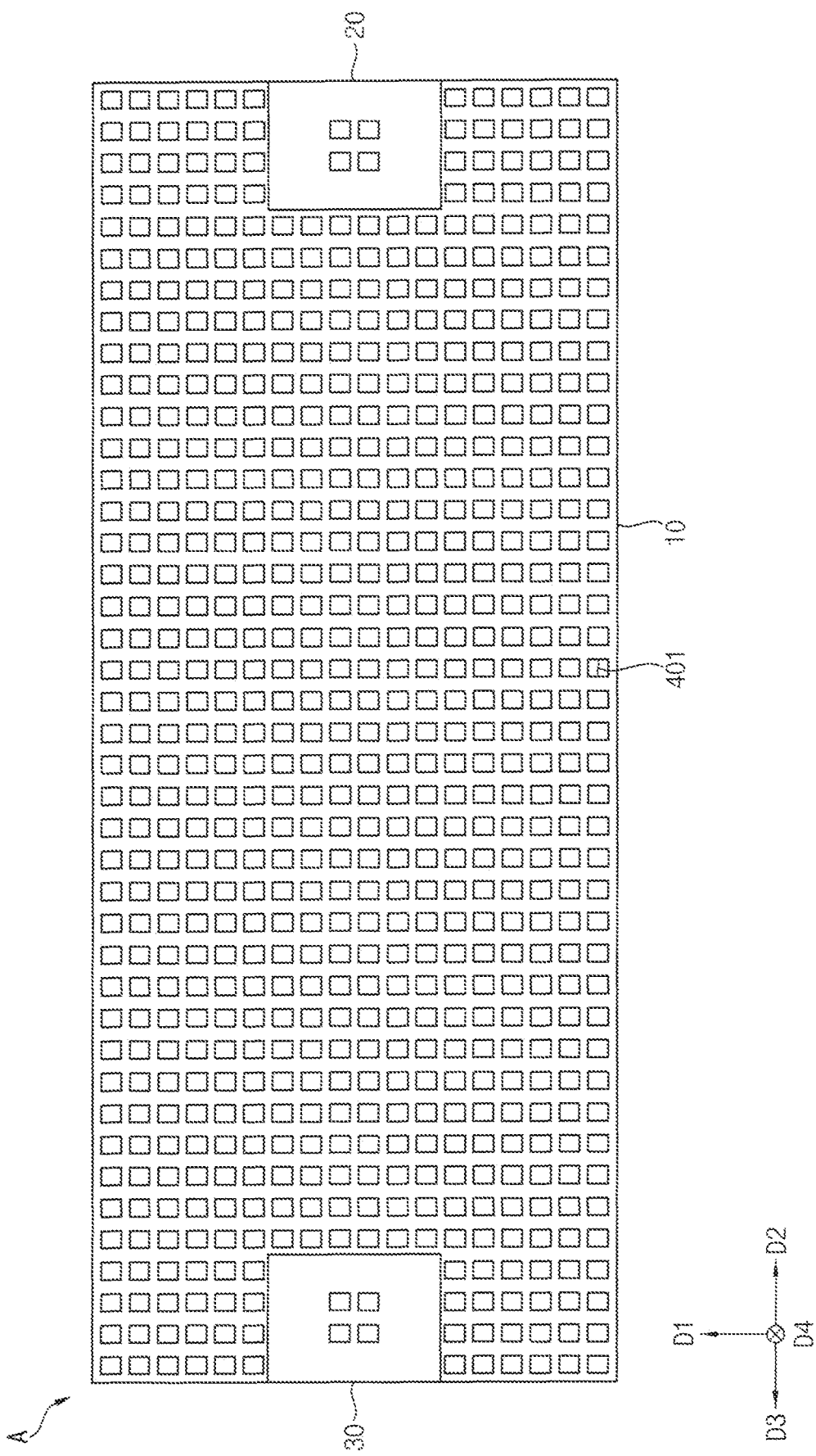
FIG. 7 is a partially enlarged plan view showing an area 'A' of FIG. 1.

FIG. 6 is a plan view showing a mask included in the mask assembly of FIG. 1, and FIG. 7 is a partially enlarged plan view showing an area 'A' of FIG. 1. For convenience of description, one mask 400 among the masks 400 of FIG. 1 has been shown in FIG. 6.

Referring to FIGS. 6 and 7, the mask 400 may include a pattern region 10, dummy opening regions 30, opening regions 20, and fixing regions 40. In the embodiments, a plurality of openings 401 may be formed in the pattern region 10, the dummy opening regions 30, and the opening regions 20, and the openings 401 may not be formed in the fixing regions 40. When an organic light emitting layer is deposited onto the mother substrate on which the cells are located by using the mask assembly 100, the openings 401 may correspond to sub-pixel regions of each of the cells.

The pattern region 10 may be located between the fixing regions 40. That is, one end of the pattern region 10 is attached to the fixing region 40, and the other end of the pattern region 10 is attached to the fixing region 40. The openings 401 formed in the pattern region 10 may be arranged at equidistant intervals. A deposition material (e.g., an organic light emitting material) may pass through the openings 401 formed in the pattern region 10.

The dummy opening regions 30 may be located within the pattern region 10. For example, the pattern region 10 may surround at least a part of each of the dummy opening regions 30. In other words, the pattern region 10 may be located between two dummy opening regions 30 adjacent to each other in the first direction D1 among the dummy opening regions 30 on the first side portion. The dummy opening regions 30 may be arranged in the first direction D1 on the first side portion of the mask 400 (or a first side portion of the pattern region 10). The openings 401 may be formed in a part of each of the dummy opening regions 30. The deposition material may pass through the openings 401 formed in the dummy opening regions 30.

The opening regions 20 may be located within the pattern region 10. For example, the pattern region 10 may surround at least a part of each of the opening regions 20. In other words, the pattern region 10 may be located between two opening regions 20 adjacent to each other in the first direction D1 among the opening regions 20 on the second side portion. The opening regions 20 may be arranged in the first direction D1 on the second side portion that is opposite to the first side portion of the mask 400 (or a second side portion of the pattern region 10). In addition, the dummy opening regions 30 and the opening regions 20 may correspond to each other. In other words, the dummy opening regions 30 and the opening regions 20 may be symmetrical to each other along the first direction D1. The openings 401 may be formed in a part of each of the opening regions 20. The deposition material may pass through the openings 401 formed in the opening regions 20.

In the embodiments, as shown in FIG. 7, the number of the openings 401 formed in each of the dummy opening regions 30 may be equal to the number of the openings 401 formed in each of the opening regions 20. In addition, a shape in which the openings 401 formed in each of the dummy opening regions 30 are arranged and a shape in which the openings 401 formed in each of the opening regions 20 are arranged may be identical and symmetrical to each other. Furthermore, the number of the openings 401 per a unit area in each of the dummy opening regions 30 and the opening regions 20 may be smaller than the number of the openings 401 per a unit area in the pattern region 10.

The fixing regions 40 may be located in an upper portion and a lower portion of the mask 400. The fixing regions 40 may face each other in the first direction D1. A part of each of the fixing regions 40 may overlap a part of the mask frame 500 shown in FIGS. 1, 2, 3, 4, and 5, and the fixing regions 40 of the mask 400 may be fixed to the mask frame 500 at the overlapping part. For example, in a process of fixing the mask 400 to the mask frame 500, each of the fixing regions 40 may be clamped, the fixing region 40 located in the upper portion of the mask 400 may be stretched in the first direction D1, and the fixing region 40 located in the lower portion of the mask 400 may be stretched in a direction opposite to the first direction D1. While the fixing regions 40 are stretched, the overlapping part may be welded and fixing by using a laser. In other embodiments, a groove may be formed in each of the fixing regions 40 to facilitate the clamping, and the fixing regions 40 of the mask 400 protruding from the mask frame 500 may be removed after the welding. In addition, dummy openings may be formed in a portion of the overlapping part of the fixing regions 40.

A conventional mask does not have the dummy opening regions 30 and the pattern region 10 surrounding at least a part of each of the dummy opening regions 30. In other words, the conventional mask has only opening regions 20, a pattern region 10, and fixing regions 40. When the conventional mask having only the fixing regions 40, the pattern region 10, and the opening regions 20 is clamped so as to be stretched in the first direction D1 and a direction opposite to the first direction D1, a bending phenomenon in which a left side (e.g., an opposite side of the opening regions 20) of the conventional mask is bent in a third direction D3 opposite to the second direction D2 may occur. For example, the conventional mask may have a 'C' shape. In this case, openings 401 may not accurately correspond to the sub-pixel regions, and a deposition failure of the organic light emitting layer may occur. The bending phenomenon as described above may occur because the number of the openings 401 per a unit area in the pattern region 10 is different from the number of the openings 401 per a unit area in each of the opening regions 20.

According to the embodiments of the present disclosure, the mask assembly 100 may include dummy opening regions 30 and a pattern region 10 surrounding at least a part of each of the dummy opening regions 30. In this case, the first side portion and the second side portion of the mask 400 may be symmetrical to each other, and the bending phenomenon may not occur even when the fixing regions 40 are clamped and stretched. Accordingly, when the organic light emitting layer is deposited by using the mask assembly 100, the openings 401 may accurately correspond to the sub-pixel regions, and the deposition failure of the organic light emitting layer may not occur.

Although four openings 401 have been described as being formed in each of the opening regions 20 and the dummy opening regions 30 of FIG. 7, the configuration of the present disclosure is not limited thereto. For example, arrangement of the openings 401 of each of the opening regions 20 and the dummy opening regions 30 of FIG. 7 may be changed according to arrangement of a sub-pixel region 61 and a transmissive region 71 in a second display region 70 of FIG. 11.

In addition, although the openings 401 of FIG. 7 have been shown as having the same shape, the configuration of the present disclosure is not limited thereto. For example, a shape of each of the openings 401 located in the pattern region 10 may be different from a shape of each of the openings 401 located in each of the dummy opening region 30 and the opening region 20. In other words, since the shape of each of the openings 401 located in the pattern region 10 is different from the shape of each of the openings 401 located in each of the opening and dummy opening regions 20 and 30, a shape of the organic light emitting layer corresponding to the pattern region 10 may be different from a shape of the organic light emitting layer corresponding to each of the dummy opening region 30 and the opening region 20. Additionally, the size of each of the openings 401 located in the pattern region 10 may be different from the size of each of the openings 401 located in the dummy opening region 30 and the dummy opening region 20.

Figure 8:
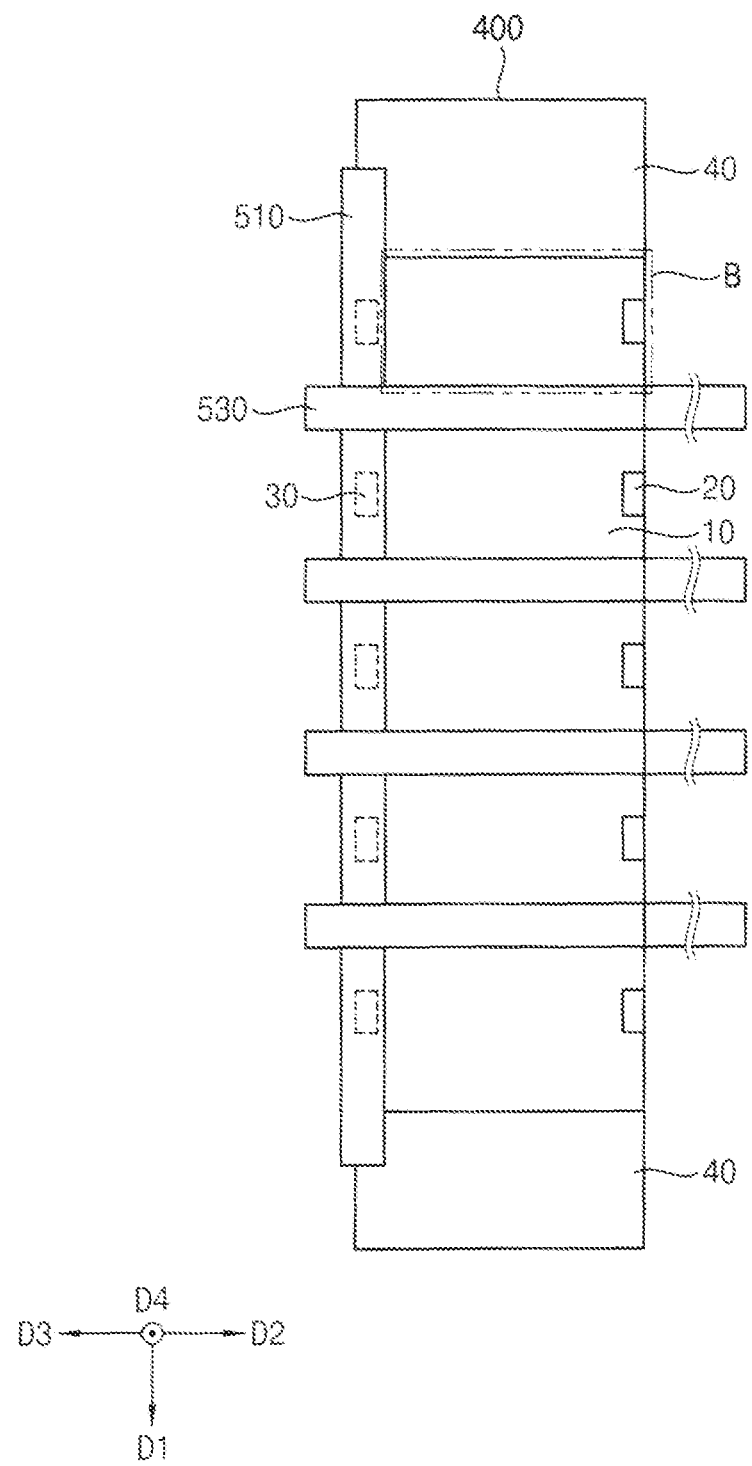
FIG. 8 is a plan view showing the support stick and the blocking stick disposed on a rear surface of the mask of FIG. 6.

FIG. 8 is a plan view showing the support stick and the blocking stick disposed on a rear surface of the mask of FIG. 6. For convenience of description, one mask 400, one blocking stick 510 among the blocking sticks 510, and the support sticks 530 have been shown in FIG. 8.

Referring to FIGS. 7 and 8, the blocking stick 510 may be disposed under the mask 400 to overlap the first side portion. The blocking stick 510 may extend in the first direction D1. In the embodiments, the blocking stick 510 may overlap the openings 401 formed in the pattern region 10 overlapping the first side portion and the openings 401 formed in the dummy opening regions 30. Therefore, the deposition material may not pass through the openings 401 formed in the pattern region 10 overlapping the first side portion and the openings 401 formed in the dummy opening regions 30. In addition, the pattern region 10 may surround at least a part of each of the dummy opening regions 30, and the blocking stick 510 may overlap a part of the pattern region 10 surrounding at least a part of each of the dummy opening regions 30. In other words, the blocking stick 510 may be disposed to overlap the openings 401 of the pattern region 10 adjacent to the dummy opening region 30 in the second direction D2. Therefore, the deposition material may not pass through the openings 401 formed in a part of the pattern region 10 surrounding at least a part of each of the dummy opening regions 30.

The support sticks 530 may be disposed under the blocking stick 510. The support sticks 530 may extend in the second direction D2 (or the third direction D3), and may be spaced apart from each other in the first direction D1. For example, one of the support sticks 530 may extend to overlap a portion between two dummy opening regions 30 adjacent to each other in the first direction D1 among the dummy opening regions 30 on the first side portion, and a portion between two opening regions 20 facing the two dummy opening regions 30. In the embodiments, the deposition material may not pass through the openings 401 formed in the pattern region 10 overlapping the support sticks 530.

In the embodiments, the deposition material may pass through the openings 401 formed in an area 'B' where the mask 400 is exposed, in which the area 'B' are defined by the fixing regions 40 (or the mask frame 500), the blocking stick 510, and the support sticks 530. In other words, the deposition material may pass through the openings 401 formed in the pattern region 10 overlapping the second side portion, the openings 401 formed in the opening regions 20, and the openings 401 formed in the pattern region 10 that does not overlap the first and second side portions.

For example, in a process of depositing an organic light emitting layer by using the mask assembly 100, a plurality of cells may be arranged on a mother substrate in a lattice shape, and the mother substrate may be located in a direction opposite to the fourth direction D4 from a top surface of the mask 400. In other words, the cells may face the mask 400. When the organic light emitting layer is deposited onto the cells by using the mask assembly 100, there may be a portion where the deposition of the organic light emitting layer is not required. For example, the deposition of the organic light emitting layer may not be required in a portion where a pad electrode is disposed, which is located in a lower portion of each of the cells, a portion where wires are disposed, which is located in an outermost periphery located in the lower portion of each of the cells, and a space between adjacent cells. In this case, the first side portion of the mask 400 may correspond to the portion where the pad electrode of each of the cells is disposed, and the blocking stick 510 may overlap the first side portion. In addition, the portion where the wires are disposed and the space between the adjacent cells may overlap the support sticks 530 and the fixing regions 40 (or the mask frame 500) of the mask 400. Accordingly, since the blocking stick 510, the support sticks 530, and the fixing regions 40 of the mask 400 are disposed in the portion where the deposition of the organic light emitting layer is not required, the deposition material may be blocked from passing through.

Figure 9:
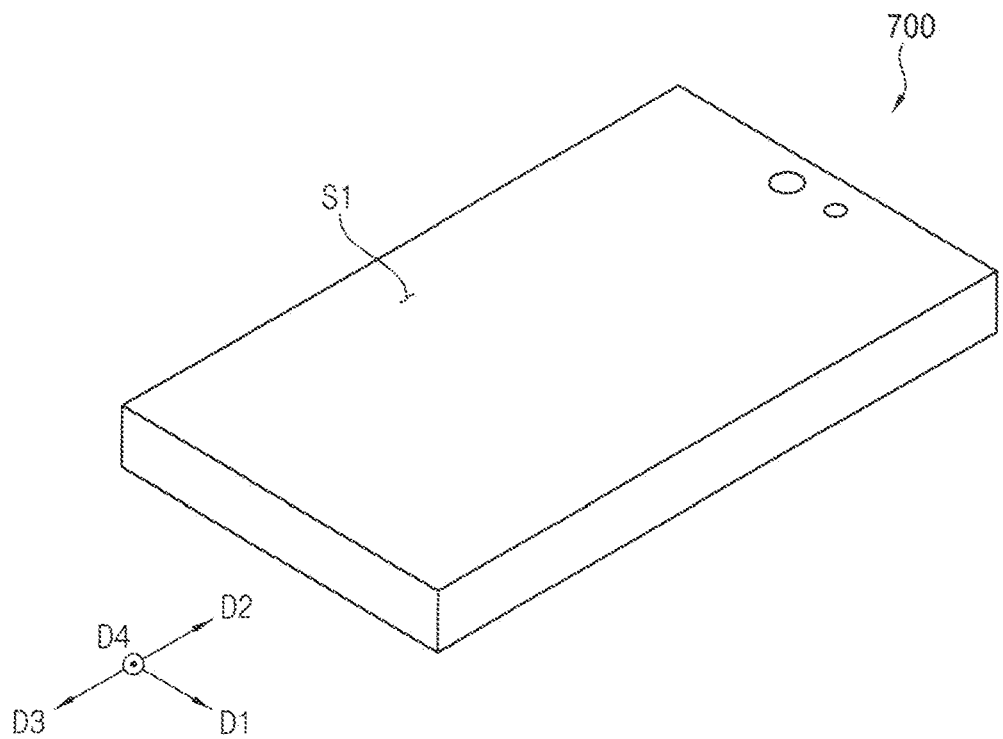
FIGS. 9 and 10 are perspective views showing an organic light emitting diode display device.
Figure 10:
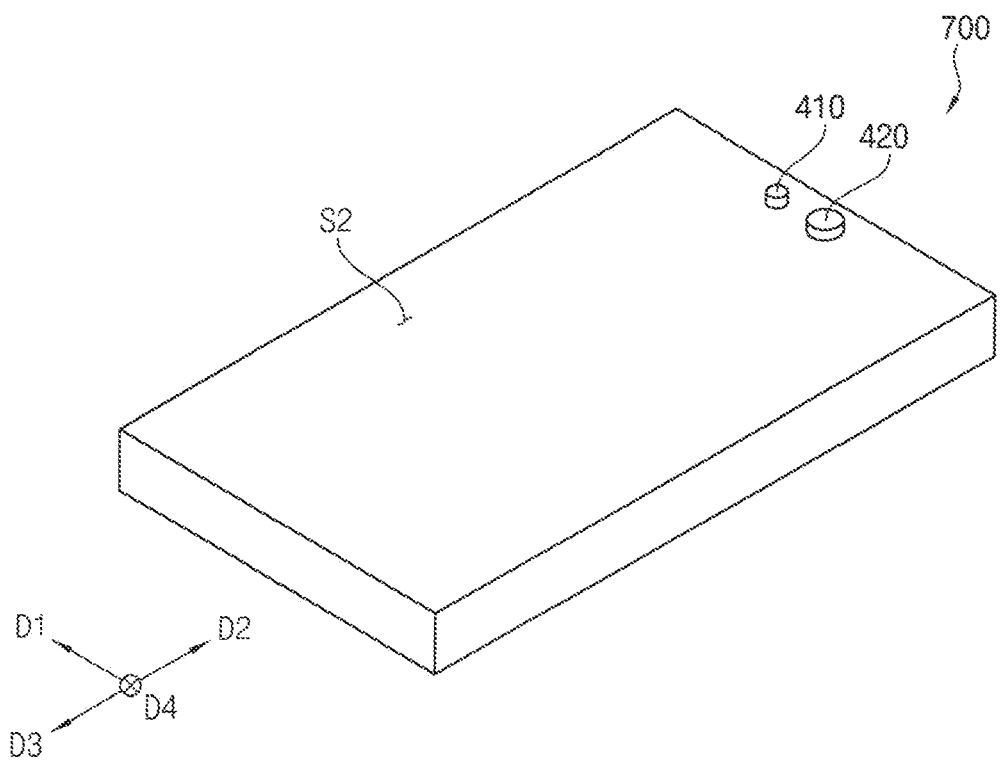

FIGS. 9 and 10 are perspective views showing an organic light emitting diode display device, and FIG. 11 is a plan view showing a display region and a module region included in the organic light emitting diode display device of FIG. 9.

Referring to FIGS. 9, 10, and 11, an organic light emitting diode display device 700 may include a first optical module 410, a second optical module 420, and the like. The organic light emitting diode display 700 may have a first surface S1 for displaying an image and a second surface S2 opposite to the first surface S1. The first optical module 410 and the second optical module 420 may be disposed on one side of the second surface S2 of the organic light emitting diode display device 700, and the first optical module 410 and the second optical module 420 may be adjacent to each other.

As shown in FIG. 11, the organic light emitting diode display device 700 may be divided into a first display region 60, a second display region 70 (or a module region), and a non-display region 80. The second display region 70 may be located on one side of the organic light emitting diode display device 700, and the first display region 60 may surround at least a part of the second display region 70. In other words, an area of the first display region 60 may be larger than an area of the second display region 70. In the embodiments, the first optical module 410 and the second optical module 420 may overlap the second display region 70. In addition, the non-display region 80 may be located on an opposite side of the organic light emitting diode display device 700, and may face the second display region 70.

The first display region 60 may include a plurality of sub-pixel regions (e.g., corresponding to a sub-pixel region 61 of FIG. 12), and the second display region 70 may include a plurality of sub-pixel regions and a transmissive region (e.g., corresponding to a sub-pixel region 61 and a transmissive region 71 of FIG. 14). For example, external light may pass through the organic light emitting diode display device 700 through the transmissive region. In the embodiments, the organic light emitting diode display device 700 may display the image in the first display region 60 and the second display region 70 at mutually different resolutions. For example, the image may be displayed in the first display region 60 at a first resolution, and the image may be displayed in the second display region 70 at a second resolution lower than the first resolution. In other words, the number of the sub-pixel regions per a unit area in the first display region 60 may be greater than the number of the sub-pixel regions per a unit area in the second display region 70. Pad electrodes electrically connected to an external device configured to generate image signals, and wires connected to the pad electrodes and extending to the first display region 60 and the second display region 70 may be disposed in the non-display region 80. In other words, the image may not be displayed in the non-display region 80.

The first optical module 410 may include a camera module for capturing (or recognizing) an image of an object located over the first surface S1 of the organic light emitting diode display device 700.

The second optical module 420 may include a face recognition sensor module for detecting a face of a user, a pupil recognition sensor module for detecting a pupil of the user, an acceleration sensor module and a geomagnetic sensor module for determining a movement of the organic light emitting diode display device 700, a proximity sensor module and an infrared sensor module for detecting proximity with respect to a front side of the organic light emitting diode display device 700, an illuminance sensor module for measuring a degree of brightness when left in a pocket or a bag, and the like.

FIG. 12 is a partially enlarged plan view showing an area 'C' of FIG. 11, FIG. 13 is a sectional view taken along line I-I' of FIG. 12, and FIG. 14 is a partially enlarged plan view showing an area 'D' of FIG. 11.

Referring to FIGS. 12, 13, and 14, the organic light emitting diode display device 700 may include a lower substrate 110, a semiconductor element 250, a planarization layer 270, a pixel defining layer 310, a lower electrode 290, an organic light emitting layer 330, an upper electrode 340, and an upper substrate 450. In this case, the semiconductor element 250 may include an active layer 130, a gate insulating layer 150, a gate electrode 170, an interlayer insulating layer 190, a source electrode 210, and a drain electrode 230.

The first display region 60 may include a plurality of sub-pixel regions 61. For example, the sub-pixel regions 61 may be arranged in the first direction D1 and the second direction D2 in the first display region 60. In other words, the sub-pixel regions 61 may be arranged over the whole first display region 60.

The second display region 70 may include a plurality of sub-pixel regions 61 and a transmissive region 71. For example, the sub-pixel regions 61 may be partially arranged in the second display region 70, and the transmissive region 71 may surround the sub-pixel regions 61. In the embodiments, the organic light emitting layers 330 may be disposed in the sub-pixel regions 61 of the first display region 60, respectively, and the organic light emitting layers 330 may be disposed in the sub-pixel regions 61 of the second display region 70, respectively. In addition, when compared with the sub-pixel regions 61 disposed in the first display region 60 of FIG. 12, the second display region 70 of FIG. 14 may include a relatively small number of sub-pixel regions 61 per a unit area due to the transmissive region 71. In other words, the second resolution of the second display region 70 may be lower than the first resolution of the first display region 60.

As described above, since the sub-pixel regions 61 are disposed such that an image may be displayed even in the module region (e.g., the second display region 70), the organic light emitting layer 330 may be formed in the sub-pixel region 61. In this case, since the first optical module 410 and the second optical module 420 are required to operate by using external light incident from the first surface S1 of the organic light emitting diode display device 700, a transmission window (e.g., the transmissive region 71) may be formed in the second display region 70 so that the external light may pass through the organic light emitting diode display device 700. For example, the first display region 60 may include sub-pixel regions 61 arranged at equidistant intervals and formed therein with the organic light emitting layers 330, respectively, and the second display region 70 may include sub-pixel regions 61 formed therein with the organic light emitting layers 330, respectively, and a transmissive region 71 formed therein with a transmission window. In other words, numbers of the sub-pixel regions 61 per a unit area in the first display region 60 and the second display region 70 may be different from each other.

In a process of manufacturing the organic light emitting diode display device 700, the organic light emitting layers 330 may be deposited by using the mask assembly 100. The area 'B' of FIG. 8 may correspond to the first display region 60 and the second display region 70, and a portion overlapping the blocking stick 510 adjacent to the area 'B' may correspond to the non-display region 80. In other words, one of the cells disposed on the mother substrate may correspond to the organic light emitting diode display device 700. Accordingly, the organic light emitting layers 330 may be formed in the sub-pixel regions 61 located in the first display region 60 and the second display region 70 by using the mask assembly 100, respectively, and the organic light emitting layer 330 may not be formed in the non-display region 80.

Referring again to FIG. 13, the lower substrate 110 including a transparent or opaque material may be provided. The lower substrate 110 may include a quartz substrate, a synthetic quartz substrate, a calcium fluoride substrate, a fluorine-doped quartz (F-doped quartz) substrate, a soda lime glass substrate, a non-alkali glass substrate, and the like.

A buffer layer (not shown) may be disposed on the lower substrate 110. The buffer layer may be disposed over the entirety of the lower substrate 110. The buffer layer may prevent metal atoms or impurities from diffusing from the lower substrate 110 into the semiconductor element 250, and may control a heat transfer rate during a crystallization process for forming the active layer 130 to obtain a substantially uniform active layer 130. In addition, when a surface of the lower substrate 110 is not uniform, the buffer layer may serve to improve flatness of the surface of the lower substrate 110. Depending on a type of the lower substrate 110, at least two buffer layers may be provided on the lower substrate 110, or the buffer layer may not be provided. For example, the buffer layer may include an organic material or an inorganic material.

The active layer 130 may be disposed in the sub-pixel region 61 on the lower substrate 110, and may include a metal oxide semiconductor, an inorganic semiconductor (e.g., amorphous silicon or poly silicon), an organic semiconductor, or the like. The semiconductor element 250 may have a source region, a drain region, and a channel region located between the source region and the drain region.

The gate insulating layer 150 may be disposed on the active layer 130. The gate insulating layer 150 may cover the active layer 130 in the sub-pixel region 61 on the lower substrate 110, and may be disposed over the whole sub-pixel region 61 on the lower substrate 110. The gate insulating layer 150 may sufficiently cover the active layer 130 on the lower substrate 110, and may have a substantially flat top surface without creating a step around the active layer 130. In some embodiments, the gate insulating layer 150 may be disposed along a profile of the active layer 130 with a uniform thickness to cover the active layer 130 on the lower substrate 110. The gate insulating layer 150 may include a silicon compound, metal oxide, and the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other embodiments, the gate insulating layer 150 may have a multilayer structure including a plurality of insulating layers. The insulating layers may include mutually different materials, and may have mutually different thicknesses.

The gate electrode 170 may be disposed in the sub-pixel region 61 on the gate insulating layer 150. In other words, the gate electrode 170 may be disposed on a portion of the gate insulating layer 150 under which the channel region of the active layer 130 is located. The gate electrode 170 may include a metal, an alloy, metal nitride, conductive metal oxide, a transparent conductive material, and the like. The gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other embodiments, the gate electrode 170 may have a multilayer structure including a plurality of metal layers. The metal layers may include mutually different materials, and may have mutually different thicknesses.

The interlayer insulating layer 190 may be disposed on the gate electrode 170. The interlayer insulating layer 190 may cover the gate electrode 170 in the sub-pixel region 61 on the gate insulating layer 150, and may be disposed over the whole gate insulating layer 150. The interlayer insulating layer 190 may sufficiently cover the gate electrode 170 on the gate insulating layer 150, and may have a substantially flat top surface without creating a step around the gate electrode 170. In some embodiments, the interlayer insulating layer 190 may be disposed along a profile of the gate electrode 170 with a uniform thickness to cover the gate electrode 170 on the gate insulating layer 150. The interlayer insulating layer 190 may include a silicon compound, metal oxide, and the like.

The source electrode 210 and the drain electrode 230 may be disposed in the sub-pixel region 61 on the interlayer insulating layer 190. The source electrode 210 may be connected to the source region of the active layer 130 through a first contact hole formed by removing first portions of the gate insulating layer 150 and the interlayer insulating layer 190, and the drain electrode 230 may be connected to the drain region of the active layer 130 through a second contact hole formed by removing second portions of the gate insulating layer 150 and the interlayer insulating layer 190. Each of the source electrode 210 and the drain electrode 230 may include a metal, an alloy, metal nitride, conductive metal oxide, a transparent conductive material, and the like. These may be used alone or in combination with each other. In other embodiments, each of the source electrode 210 and the drain electrode 230 may have a multilayer structure including a plurality of metal layers. The metal layers may include mutually different materials, and may have mutually different thicknesses.

Accordingly, the semiconductor element 250 including the active layer 130, the gate insulating layer 150, the gate electrode 170, the interlayer insulating layer 190, the source electrode 210, and the drain electrode 230 may be provided.

The planarization layer 270 may be disposed in the sub-pixel region 61 on the interlayer insulating layer 190, the source electrode 210, and the drain electrode 230. For example, the planarization layer 270 may have thickness to sufficiently cover the source and drain electrodes 210 and 230 on the interlayer insulating layer 190. In this case, the planarization layer 270 may have a substantially flat top surface. In order to implement such a flat top surface of the planarization layer 270, a planarization process may be additionally performed on the planarization layer 270. A top surface of the drain electrode 230 may be partially exposed through a contact hole formed by removing a part of the planarization layer 270. The planarization layer 270 may include an organic material or an inorganic material. In the embodiments, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, and the like.

The lower electrode 290 may be disposed in the sub-pixel region 61 on the planarization layer 270. The lower electrode 290 may pass through a contact hole of the planarization layer 270 so as to be connected to the drain electrode 230. In addition, the lower electrode 290 may be electrically connected to the semiconductor element 250. The lower electrode 290 may include a metal, an alloy, metal nitride, conductive metal oxide, a transparent conductive material, and the like. These may be used alone or in combination with each other. In other embodiments, the lower electrode 290 may have a multilayer structure including a plurality of metal layers. The metal layers may include mutually different materials, and may have mutually different thicknesses.

The pixel defining layer 310 may be disposed on a part of the lower electrode 290 and the planarization layer 270. The pixel defining layer 310 may cover both side portions of the lower electrode 290, and may expose a part of a top surface of the lower electrode 290. The pixel defining layer 310 may be formed of an organic material or an inorganic material. In the embodiments, the pixel defining layer 310 may include an organic material.

The organic light emitting layer 330 may be disposed in the sub-pixel region 61 on the lower electrode 290 exposed by the pixel defining layer 310. The organic light emitting layer 330 may be formed by using at least one of light emitting materials for emitting different color lights (i.e., red light, green light, blue light, etc.) according to sub-pixels. Alternatively, the organic light emitting layer 330 may be formed by stacking a plurality of light emitting materials for generating different color lights such as red light, green light, and blue light to emit white light as a whole. In the embodiments, the organic light emitting layer 330 may be formed by using the mask assembly 100 of FIG. 1.

The upper electrode 340 may be disposed in the sub-pixel region 61 on the pixel defining layer 310 and the light emitting layer 330. The upper electrode 340 may include a metal, an alloy, metal nitride, conductive metal oxide, a transparent conductive material, and the like. These may be used alone or in combination with each other. In other embodiments, the upper electrode 340 may have a multilayer structure including a plurality of metal layers. The metal layers may include mutually different materials, and may have mutually different thicknesses.

The upper substrate 450 may be disposed on the upper electrode 340. The upper substrate 450 may include substantially the same material as the lower substrate 110. For example, the upper substrate 450 may include a quartz substrate, a synthetic quartz substrate, a calcium fluoride substrate, a fluorine-doped quartz substrate, a soda lime glass substrate, a non-alkali glass substrate, and the like.

Accordingly, the organic light emitting diode display device 700 shown in FIG. 13 may be provided.

Figure 16:
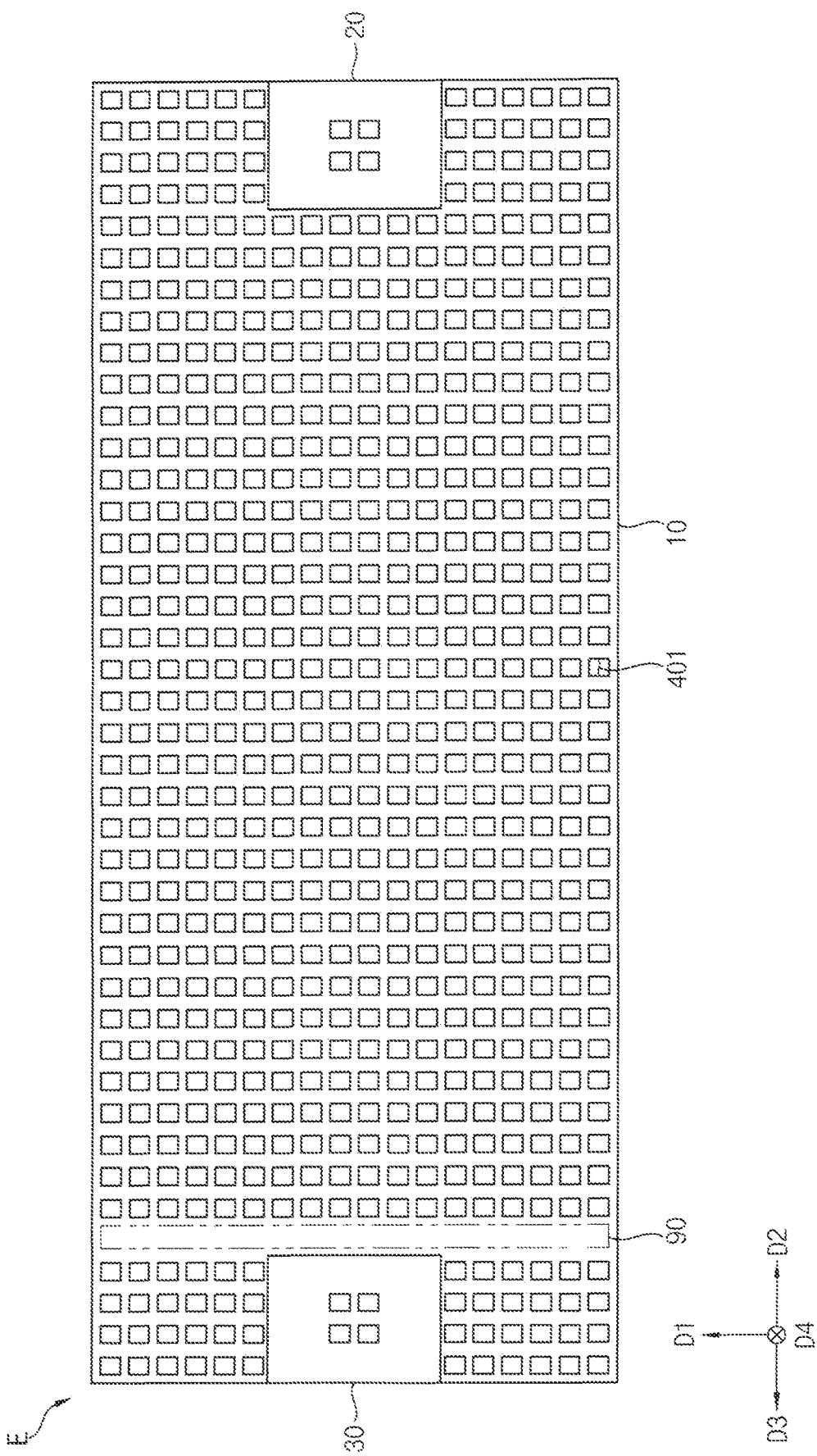
FIG. 16 is a partially enlarged plan view showing an area 'E' of FIG. 15.

FIG. 15 is a plan view showing a mask assembly according to embodiments of the present disclosure, and FIG. 16 is a partially enlarged plan view showing an area 'E' of FIG. 15. A mask assembly 1000 illustrated in FIGS. 15 and 16 may have a configuration that is substantially identical or similar to the configuration of the mask assembly 100 described with reference to FIGS. 1, 2, 3, 4, 5, 6, 7 and 8 except for a blocking region 90. In FIGS. 15 and 16, redundant descriptions of components that are substantially identical or similar to the components described with reference to FIGS. 1, 2, 3, 4, 5, 6, 7 and 8 will be omitted.

Referring to FIGS. 11, 15, and 16, the mask 400 may include a pattern region 10, dummy opening regions 30, opening regions 20, a blocking region 90, and fixing regions 40. In the embodiments, a plurality of openings 401 may be formed in the pattern region 10, the dummy opening regions 30, and the opening regions 20, and the openings 401 may not be formed in the fixing regions 40 and the blocking region 90. When an organic light emitting layer is deposited onto the mother substrate on which the cells are located by using the mask assembly 1000, the openings 401 may correspond to sub-pixel regions of each of the cells.

The blocking stick 510 may overlap the first side portion of the mask 400 so that the organic light emitting layer 330 may not be formed in the non-display region 80 of FIG. 11. In this case, depending on an area of the non-display region 80, the blocking stick 510 may be required to overlap the openings 401 of the pattern region 10 adjacent to the dummy opening region 30 in the second direction D2. In this case, the blocking stick 510 may not accurately overlap the openings 401 of the pattern region 10 adjacent to the dummy opening region 30 in the second direction D2.

For example, in a process of manufacturing the mask assembly 1000, when the mask 400 is welded to the mask frame 500 after the blocking stick 510 is fastened to the mask frame 500, a manufacturing tolerance may be generated, and the mask 400 may include a blocking region 90 in order to ensure a margin caused by the manufacturing tolerance. In other words, since the openings 401 are not formed in the blocking region 90, the blocking stick 510 may ensure a manufacturing tolerance as much as the blocking region 90.

According to the embodiments of the present disclosure, the mask assembly 1000 may include a mask 400 having a blocking region 90. In this case, since the openings 401 are not formed in the blocking region 90, the blocking stick 510 may ensure a manufacturing tolerance as much as the blocking region 90. Accordingly, the blocking stick 510 may easily cover the non-display region 80, and the organic light emitting layer 330 may not be deposited onto the non-display region 80.

FIG. 17 is a plan view showing a mask assembly according to embodiments of the present disclosure. A mask assembly 1200 illustrated in FIG. 17 may have a configuration that is substantially identical or similar to the mask assembly 100 described with reference to FIGS. 1, 2, 3, 4, 5, 6, 7 and 8 except for openings 402 formed in the dummy opening regions 30 and the opening regions 20. In FIG. 17, redundant descriptions of components that are substantially identical or similar to the components described with reference to FIGS. 1, 2, 3, 4, 5, 6, 7 and 8 will be omitted. For example, FIG. 17 may correspond to a partially enlarged plan view showing the area 'A' of FIG. 1.

Referring to FIGS. 1 to 6, 8, and 17, the mask 400 may include a pattern region 10, dummy opening regions 30, opening regions 20, and fixing regions 40. In the embodiments, first openings 401 may be formed in the pattern region 10, second openings 402 may be formed in the dummy opening regions 30 and the opening regions 20, and the openings 401 may not be formed in the fixing regions 40. When an organic light emitting layer is deposited onto the mother substrate on which the cells are located by using the mask assembly 1200, the openings 401 and 402 may correspond to sub-pixel regions of each of the cells. In other words, a deposition material (e.g., an organic light emitting material) may pass through the openings 401 and 402.

In the embodiments, a size of each of the first openings 401 may be different from a size of each of the second openings 402. For example, the size of each of the second openings 402 may be larger than the size of each of the first openings 401. The opening region 20 may correspond to the second display region 70 shown in FIG. 11, and the second display region 70 may include the sub-pixel regions 61 and the transmissive region 71 shown in FIG. 14. In this case, the second openings 402 may correspond to the sub-pixel regions 61. In addition, the first and second optical modules 410 and 420 shown in FIG. 10 may be disposed in the second display region 70. Meanwhile, the pattern region 10 may correspond to the first display region 60 of FIG. 11, and the first display region 60 may include the sub-pixel regions 61 shown in FIG. 12.

When compared with the first display region 60, the second display region 70 may include a relatively small number of sub-pixel regions 61, and current density in the second display region 70 is required to be increased in order to adjust luminance of the second display region 70 to a level similar to luminance of the first display region 60 located at a periphery of the second display region 70, so that a lifespan of pixels in the second display region 70 may be reduced. In the embodiments, since the size of each of the second openings 402 is larger than the size of each of the first openings 401, the sub-pixel region 61 located in the second display region 70 may have a relatively large size. When the sub-pixel region 61 located in the second display region 70 has a relatively large size, the current density of the pixels disposed in the second display region 70 may be reduced, so that the lifespan of the pixels disposed in the second display region 70 may not be reduced.

FIG. 18 is a plan view showing a mask assembly according to embodiments of the present disclosure. A mask assembly 1300 illustrated in FIG. 18 may have a configuration that is substantially identical or similar to the mask assembly 100 described with reference to FIGS. 1, 2, 3, 4, 5, 6, 7 and 8 except for openings 403 formed in the dummy opening regions 30 and the opening regions 20. In FIG. 18, redundant descriptions of components that are substantially identical or similar to the components described with reference to FIGS. 1, 2, 3, 4, 5, 6, 7 and 8 will be omitted. For example, FIG. 18 may correspond to a partially enlarged plan view showing the area 'A' of FIG. 1.

Referring to FIGS. 1 to 6, 8, and 18, the mask 400 may include a pattern region 10, dummy opening regions 30, opening regions 20, and fixing regions 40. In the embodiments, first openings 401 may be formed in the pattern region 10, second openings 403 may be formed in the dummy opening regions 30 and the opening regions 20, and the openings 401 may not be formed in the fixing regions 40. When an organic light emitting layer is deposited onto the mother substrate on which the cells are located by using the mask assembly 1300, the openings 401 and 403 may correspond to sub-pixel regions of each of the cells. In other words, a deposition material (e.g., an organic light emitting material) may pass through the openings 401 and 403.

In the embodiments, a size of each of the first openings 401 may be different from a size of each of the second openings 403. For example, the size of each of the second openings 403 may be smaller than the size of each of the first openings 401. The opening region 20 may correspond to the second display region 70 shown in FIG. 11, and the second display region 70 may include the sub-pixel regions 61 and the transmissive region 71 shown in FIG. 14. In this case, the second openings 403 may correspond to the sub-pixel regions 61. In addition, the first and second optical modules 410 and 420 shown in FIG. 10 may be disposed in the second display region 70. Meanwhile, the pattern region 10 may correspond to the first display region 60 of FIG. 11, and the first display region 60 may include the sub-pixel regions 61 shown in FIG. 12.

In the embodiments, when compared with the first display region 60, the second display region 70 may include a relatively small number of sub-pixel regions 61, and a sub-pixel region 61 having a relatively small size. Accordingly, a size of the transmissive region 71 of the second display region 70 may be relatively increased, and external light passing through the transmissive region 71 may be relatively increased. In this case, image quality of the first optical module 410 (e.g., a camera module) and sensing quality of the second optical module 420 (e.g., a face recognition sensor module, a pupil recognition sensor module, an acceleration sensor module, a geomagnetic sensor module, a proximity sensor module, an infrared sensor module, and an illuminance sensor module) may be improved.

The present disclosure may be applied to various mask assemblies including a mask. For example, the present disclosure may be applied to a number of mask assemblies such as a metal mask assembly for depositing of an organic light emitting layer, a metal mask assembly for depositing of a thin film, etc The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A mask assembly comprising:
   a mask including a pattern region where openings are formed, the mask extending in a first direction; and
   a blocking stick disposed under the mask, overlapping a first side portion of the mask, and extending in the first direction,
   wherein the mask further includes:
      dummy opening regions disposed in the pattern region and arranged in the first direction in the first side portion of the mask, the dummy opening regions where openings are formed; and
      opening regions disposed in the pattern region and arranged in the first direction in a second side portion that is opposite to the first side portion of the mask, the opening regions corresponding to the dummy opening regions, respectively, the opening regions where openings are formed, and
   a number of the openings per a unit area in each of the dummy opening region and the opening region is smaller than a number of the openings per a unit area in the pattern region.

2. The mask assembly of claim 1, wherein the number of the openings formed in each of the dummy opening regions is equal to the number of the openings formed in each of the opening regions.

3. The mask assembly of claim 1, wherein a shape in which the openings formed in each of the dummy opening regions are arranged, and a shape in which the openings formed in each of the opening regions are arranged are identical and symmetrical to each other.

4. The mask assembly of claim 1, wherein the pattern region is located between two dummy opening regions adjacent to each other in the first direction among the dummy opening regions in the first side portion.

5. The mask assembly of claim 4, wherein a deposition material does not pass through the openings formed in the pattern region overlapping the first side portion and the openings formed in the dummy opening region.

6. The mask assembly of claim 4, wherein the blocking stick overlaps the openings formed in the pattern region overlapping the first side portion and the openings formed in the dummy opening region.

7. The mask assembly of claim 1, wherein the pattern region is located between two opening regions adjacent to each other in the first direction among the opening regions in the second side portion.

8. The mask assembly of claim 7, wherein a deposition material passes through the openings formed in the pattern region overlapping the second side portion, the openings formed in the opening region, and the openings formed in the pattern region that does not overlap the first and second side portions.

9. The mask assembly of claim 1, wherein the pattern region surrounds at least a part of each of the dummy opening regions and the opening regions.

10. The mask assembly of claim 1, further comprising support sticks disposed under the mask, each extending in a second direction orthogonal to the first direction, and spaced apart from each other in the first direction.

11. The mask assembly of claim 10, wherein the support sticks are spaced apart from each other along the first direction, and
   the support sticks are disposed under the blocking stick.

12. The mask assembly of claim 10, wherein a deposition material does not pass through the openings formed in the pattern region overlapping the support sticks and the blocking stick.

13. The mask assembly of claim 12, wherein one of the support sticks extends to overlap a portion between two dummy opening regions adjacent to each other in the first direction among the dummy opening regions in the first side portion and a portion between two opening regions facing the two dummy opening regions.

14. The mask assembly of claim 10, further comprising a mask frame disposed under the mask, fastened to both side portions of each of the blocking stick and both side portions of each of the support sticks, and having an opening that exposes the pattern region of the mask.

15. The mask assembly of claim 14, wherein the mask further includes fixing regions located in upper and lower portions of the pattern region,
   the fixing regions face each other in the first direction, and
   a part of each of the fixing regions overlaps the mask frame.

16. The mask assembly of claim 1, wherein the mask includes first to $n^{th}$ masks (where n is an integer greater than or equal to 1), and
   $k^{th}$ and $(k+1)^{th}$ masks (where k is an integer between 1 and n) among the first to $n^{th}$ masks are spaced apart from each other in a second direction perpendicular to the first direction.

17. The mask assembly of claim 16, wherein the blocking stick includes first to $m^{th}$ blocking sticks (where m is an integer greater than or equal to 1), and
   a $j^{th}$ blocking stick (where j is an integer between 1 and m) among the first to $m^{th}$ blocking sticks overlaps a first side portion of the $(k+1)^{th}$ mask without overlapping a second side portion of the $k^{th}$ mask.

18. The mask assembly of claim 1, wherein the openings of the pattern region adjacent to the dummy opening region in a second direction overlap the blocking stick.

19. The mask assembly of claim 1, wherein no openings are formed in the pattern region adjacent to the dummy opening region in a second direction.

20. A mask assembly comprising:
a mask including a pattern region where openings are formed, the mask extending in a first direction; and
a blocking stick disposed under the mask, overlapping a first side portion of the mask, and extending in the first direction,
wherein the mask further includes:
  dummy opening regions disposed in the pattern region and arranged in the first direction in the first side portion of the mask, the dummy opening regions where openings are formed; and
  opening regions disposed in the pattern region and arranged in the first direction on a second side portion that is opposite to the first side portion of the mask, the opening regions corresponding to the dummy opening regions, respectively, the opening regions where openings are formed,
a number of the openings per a unit area in each of the dummy opening region and the opening region is smaller than a number of the openings per a unit area in the pattern region, and
a size of each of the openings formed in the opening region is different from a size of each of the openings formed in the pattern region.

* * * * *